United States Patent
Egusa et al.

(10) Patent No.: US 11,569,197 B2
(45) Date of Patent: Jan. 31, 2023

(54) ULTRASONIC BONDING APPARATUS, ULTRASONIC BONDING INSPECTION METHOD AND ULTRASONICALLY-BONDED PORTION FABRICATION METHOD

(71) Applicant: Mitsubishi Electric Corporation, Tokyo (JP)

(72) Inventors: Minoru Egusa, Tokyo (JP); Shingo Sudo, Tokyo (JP); Kazuyuki Hashimoto, Tamba (JP); Erubi Suzuki, Tamba (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 849 days.

(21) Appl. No.: 16/478,218

(22) PCT Filed: Feb. 2, 2018

(86) PCT No.: PCT/JP2018/003605
§ 371 (c)(1),
(2) Date: Jul. 16, 2019

(87) PCT Pub. No.: WO2018/143410
PCT Pub. Date: Aug. 9, 2018

(65) Prior Publication Data
US 2020/0035642 A1 Jan. 30, 2020

(30) Foreign Application Priority Data
Feb. 3, 2017 (JP) .............................. JP2017-018138

(51) Int. Cl.
*G01N 29/44* (2006.01)
*H01L 23/00* (2006.01)
(Continued)

(52) U.S. Cl.
CPC .............. *H01L 24/85* (2013.01); *B23K 20/10* (2013.01); *G01H 17/00* (2013.01); *G01N 29/14* (2013.01);
(Continued)

(58) Field of Classification Search
CPC ....... H01L 24/85; H01L 23/053; H01L 24/29; H01L 24/32; H01L 24/45; H01L 24/48;
(Continued)

(56) References Cited

U.S. PATENT DOCUMENTS

| 2003/0218050 A1 | 11/2003 | Kanemoto et al. |
| 2012/0011934 A1 | 1/2012 | Matsui et al. |
| 2013/0056154 A1* | 3/2013 | Nakaya ............. H01J 37/32944 156/345.24 |

FOREIGN PATENT DOCUMENTS

| JP | H05115986 A | 5/1993 |
| JP | H07035668 A | 2/1995 |

(Continued)

OTHER PUBLICATIONS

Office Action dated Mar. 24, 2020, issued in corresponding Japanese Patent Application No. JP 2018-566124, 14 pages including 7 pages of English translation.

(Continued)

*Primary Examiner* — Suman K Nath
(74) *Attorney, Agent, or Firm* — Buchanan Ingersoll & Rooney PC

(57) ABSTRACT

An ultrasonic bonding apparatus includes an ultrasonic bonding machine having an ultrasonic tool for applying an ultrasonic wave to a bonding target member mounted on a fixed object fixed to a jig, while pressing a bonding member against the bonding target member; and a bonding inspection apparatus for inspecting a bonding quality of the bonding target member and the bonding member. The bond- (Continued)

ing inspection apparatus includes: a bonded-state measuring device for detecting a vibration in the jig or a housing of the ultrasonic bonding machine equipped with the jig, to thereby output a detection signal; and a bonded-state determination device for determining, in a bonding process for the bonding target member and the bonding member, a bonded state between the bonding target member and the bonding member on the basis of the detection signal outputted by the bonded-state measuring device.

6 Claims, 17 Drawing Sheets

(51) Int. Cl.
*B23K 20/10* (2006.01)
*G01H 17/00* (2006.01)
*G01N 29/14* (2006.01)
*G01H 5/00* (2006.01)

(52) U.S. Cl.
CPC ........... *G01N 29/4436* (2013.01); *G01H 5/00* (2013.01); *G01N 2291/0289* (2013.01); *G01N 2291/2697* (2013.01); *H01L 2224/85205* (2013.01)

(58) Field of Classification Search
CPC ... H01L 24/73; H01L 24/75; H01L 23/49811; H01L 2924/3511; H01L 2924/19107; H01L 25/07; H01L 2224/32225; H01L 2224/45124; H01L 2224/48091; H01L 2224/48137; H01L 2224/48227; H01L 2224/48472; H01L 2224/73265; H01L 2224/859; H01L 2224/291; H01L 2224/85205; B23K 20/10; B23K 31/125; G01H 17/00; G01H 5/00; G01H 3/04; G01H 11/08; G01N 29/14; G01N 29/4436; G01N 2291/0289; B06B 3/00
See application file for complete search history.

(56) References Cited

FOREIGN PATENT DOCUMENTS

| | | |
|---|---|---|
| JP | H10260164 A | 9/1998 |
| JP | H11197854 A | 7/1999 |
| JP | 2004047944 A | 2/2004 |
| JP | 2004058523 A | 2/2004 |
| JP | 2012035299 A | 2/2012 |
| JP | 2012083246 A | 4/2012 |
| JP | 2013191716 A | 9/2013 |
| JP | 2016119374 A | 6/2016 |
| WO | 2010113250 A1 | 10/2010 |

OTHER PUBLICATIONS

International Search Report (PCT/ISA/210) dated Apr. 24, 2018, by the Japan Patent Office as the International Searching Authority for International Application No. PCT/JP2018/003605.
Written Opinion (PCT/ISA/237) dated Apr. 24, 2018, by the Japan Patent Office as the International Searching Authority for International Application No. PCT/JP2018/003605.
Office Action dated Aug. 31, 2022, issued in Chinese Patent Application No. 201880007190.6, 28 pages including 17 pages of English Translation.

* cited by examiner

ULTRASONIC BONDING APPARATUS, ULTRASONIC BONDING INSPECTION METHOD AND ULTRASONICALLY-BONDED PORTION FABRICATION METHOD

TECHNICAL FIELD

The present invention relates to an ultrasonic bonding apparatus for ultrasonically bonding a bonding member to a bonding target member, and an ultrasonic bonding inspection method for inspecting a bonding quality of the bonding member ultrasonically bonded to the bonding target member.

BACKGROUND ART

In Patent Document 1, there is disclosed a bonding inspection method for inspecting a bonded portion obtained by ultrasonic bonding between an electrode of a semiconductor element mounted in a semiconductor device and a tape for bonding. The bonding inspection method of Patent Document 1 is an inspection method for precisely recognizing a void portion, etc. of a several μm level that can not be determined to be a bonding defect immediately from waveform data, etc. at the time of bonding. Specifically, the bonding inspection method of Patent Document 1 is an inspection method in which, after completion of the bonding, an ultrasonic wave is applied near the bonded portion and a vibration due to the ultrasonic wave propagating from the ultrasonic-wave applied portion is detected by way of heat or sound (AE (Acoustic Emission))), so that the bonded state is recognized based on detection data thus obtained.

In Patent Document 2, there is disclosed a bonding quality inspection apparatus and a bonding quality inspection method for inspecting, when an IGBT element and a wiring terminal are ultrasonically bonded together using a wire, the bonding quality of an ultrasonically-bonded portion of the wiring terminal and the wire. The bonding quality inspection method of Patent Document 2 is a method in which the bonding quality is inspected according to a bonding waveform of a push-in amount, etc. of a bonding tool that is acquired in the bonding apparatus (ultrasonic bonding apparatus).

In Patent Document 3, there is disclosed an ultrasonic-bonding control apparatus for determining, at the time a bonding member and a bonding target member are bonded together by the application of an ultrasonic wave using an ultrasonic bonding apparatus, whether or not a crack failure or a bonding peel-off trouble occurs in at least one of the bonding member and the bonding target member. The ultrasonic-bonding control apparatus of Patent Document 3 determines the bonded state of the bonding member or the bonding target member on the basis of an output signal from a vibration sensor abutting on the bonding target member or a vibration sensor attached to a contactor for pressing the bonding member.

CITATION LIST

Patent Document

Patent Document 1: Japanese Patent Application Laid-open No. 2012-83246 (Paragraphs 0016 to 0027; FIG. 3, FIG. 4)
Patent Document 2: International Application Publication No. WO2010/113250 (Paragraphs 0045 to 0058 and 0089; FIG. 1, FIG. 4, FIG. 5)
Patent Document 3: Japanese Patent Application Laid-open No. 2012-35299 (Paragraphs 0044, 0045, 0082 and 0083; FIG. 1, FIG. 8)

SUMMARY OF THE INVENTION

Problems to be Solved by the Invention

According to the bonding inspection method of Patent Document 1, because the ultrasonic wave is applied after completion of the bonding, there is a problem that the time for applying the ultrasonic wave arises, so that it takes time to manufacture a semiconductor device. Further, according to the bonding inspection method of Patent Document 1, there is a problem that, when, after completion of the bonding an unevenness, a foreign substance or the like exists on the surface of a portion to which the ultrasonic wave is to be applied, the ultrasonic wave is not properly applied thus making the detection data abnormal, so that the bonding quality is, even though not problematic, erroneously determined to be problematic.

In the bonding quality inspection method of Patent Document 2, the bonding quality is inspected according to the bonding waveform of a push-in amount, etc. of the bonding tool that is acquired in the bonding apparatus. However, in the ultrasonic bonding, although an applied load and an amount of applied displacement (push-in amount) are the main bonding parameters, even when the amount of applied displacement is set to a certain value, the actual amount of applied displacement may be different therefrom depending on the rigidity of the bonding target member or the bonding member. In addition, the bonding quality also varies due to the influence of a foreign substance or an oxide film on the interface in the bonded portion. Thus, according to the bonding quality inspection method of Patent Document 2, there is a problem that it is unable to precisely inspect the bonding quality according only to the waveform acquired in the bonding apparatus (ultrasonic bonding apparatus).

The ultrasonic-bonding control apparatus of Patent Document 3 is provided with the purpose of determining the bonded state through detection of a vibration in such a manner that the vibration sensor is attached to the bonding target member or to the contactor for pressing the bonding member. However, it requires causing the vibration sensor to abut on a product including the bonding target member, or attaching the vibration sensor to the contactor that is joined to a lead member for pressing the bonding member, namely, to a vibration transmission member placed between the lead member to which the ultrasonic horn is connected and the bonding target member or the bonding member. Thus, there is a problem that the productivity decreases.

The present invention has been made to solve the problems as described above, and an object thereof is to provide an ultrasonic bonding apparatus, an ultrasonic bonding inspection method and an ultrasonically-bonded portion fabrication method, in which the bonding quality of the bonding member ultrasonically bonded to the bonding target member is precisely determined to be defective or not in a short time.

Means for Solving the Problems

The ultrasonic bonding apparatus of the invention is an ultrasonic bonding apparatus for bonding a bonding target member and a bonding member together using an ultrasonic wave, and comprises: an ultrasonic bonding machine having an ultrasonic tool for applying the ultrasonic wave to the bonding target member mounted on a fixed object fixed to a jig, while pressing the bonding member against the bonding target member; and a bonding inspection apparatus for inspecting a bonding quality of the bonding target member and the bonding member. The bonding inspection apparatus in the ultrasonic bonding apparatus is characterized by comprising: a bonded-state measuring device for detecting a vibration propagating in the jig or a housing of the ultrasonic bonding machine equipped with the jig, using a sensor that is fixed to the jig or the housing at a position at which it does not make contact with the bonding target member and the bonding member and that detects the vibration, to thereby output a detection signal; and a bonded-state determination device for determining, in a bonding process for the bonding target member and the bonding member, a bonded state between the bonding target member and the bonding member on the basis of the detection signal outputted by the bonded-state measuring device.

Effect of the Invention

According to the ultrasonic bonding apparatus of the invention, since it determines the bonded state between the bonding target member and the bonding member on the basis of the detection signal outputted by the bonded-state measuring device in the bonding process, it is possible to inspect the bonding quality in real-time in the bonding process, and to reduce time taken for the quality inspection, and further to accurately determine whether the quality is defective or not.

MODES FOR CARRYING OUT THE INVENTION

Embodiment 1

Figure 1:
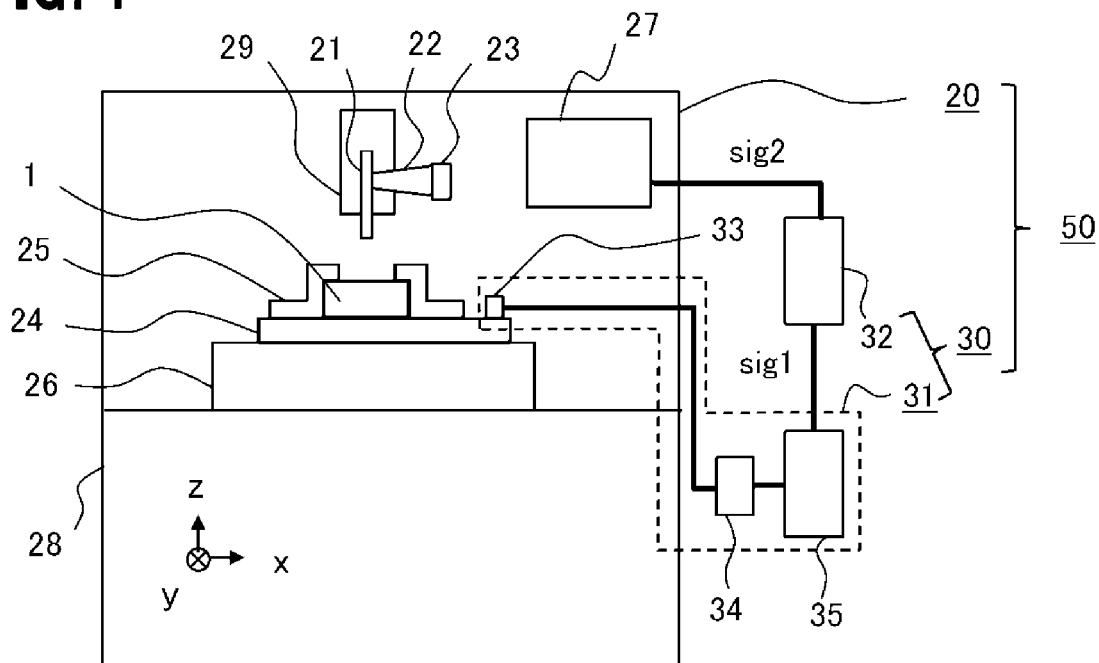
FIG. 1 is a diagram showing an ultrasonic bonding apparatus according to Embodiment 1 of the invention.
Figure 2:
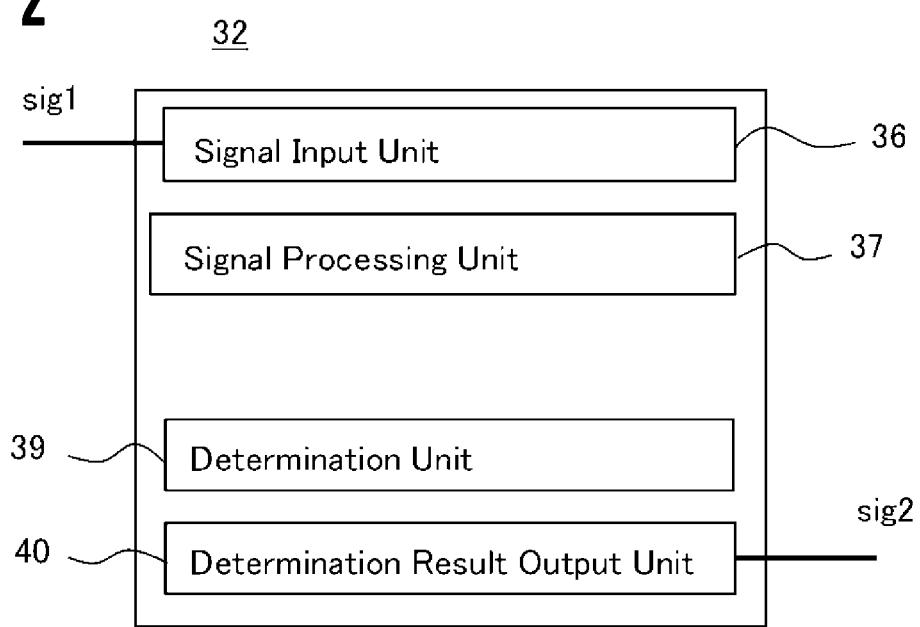
FIG. 2 is a block diagram of a bonded-state determination device in FIG. 1.
Figure 3:
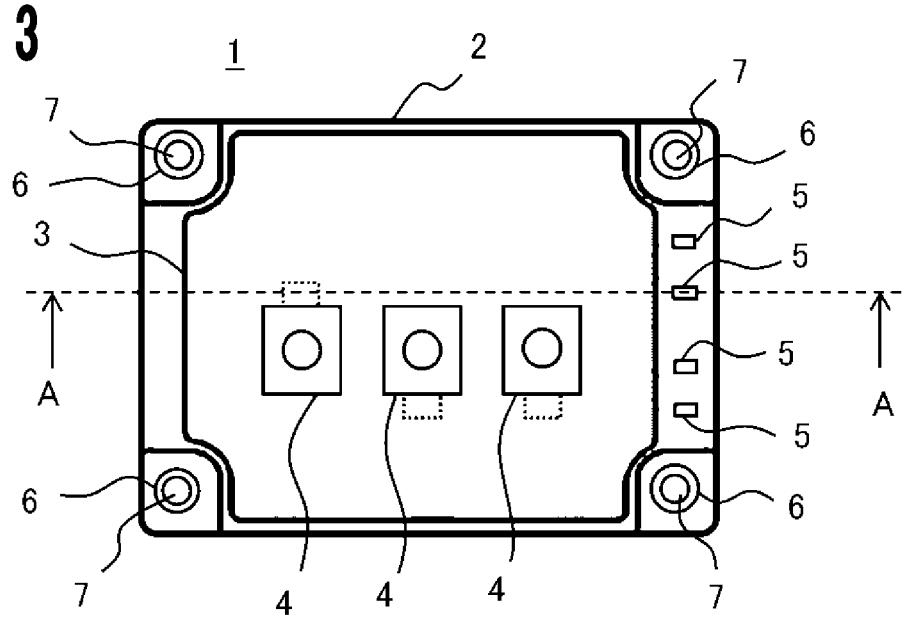
FIG. 3 is a top view of a power semiconductor device in FIG. 1.
Figure 4:
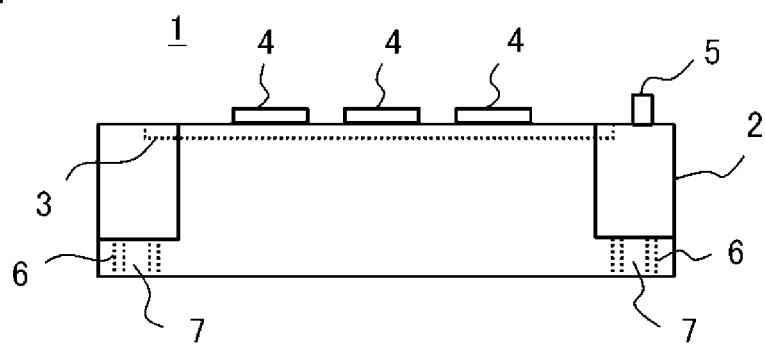
FIG. 4 is a side view of the power semiconductor device of FIG. 3.
Figure 5:
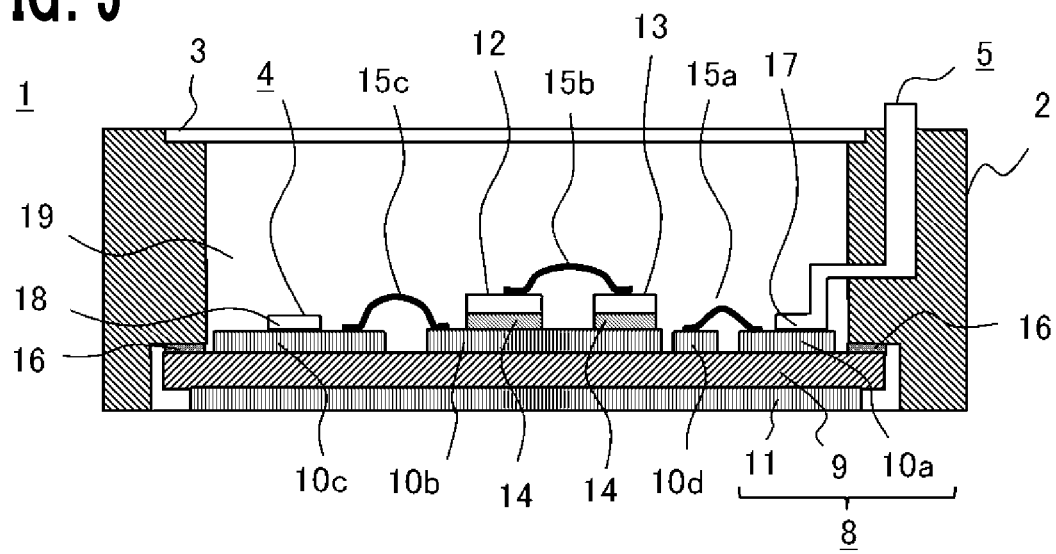
FIG. 5 is a cross-sectional view at a section along A-A of the power semiconductor device of FIG. 3.
Figure 6:
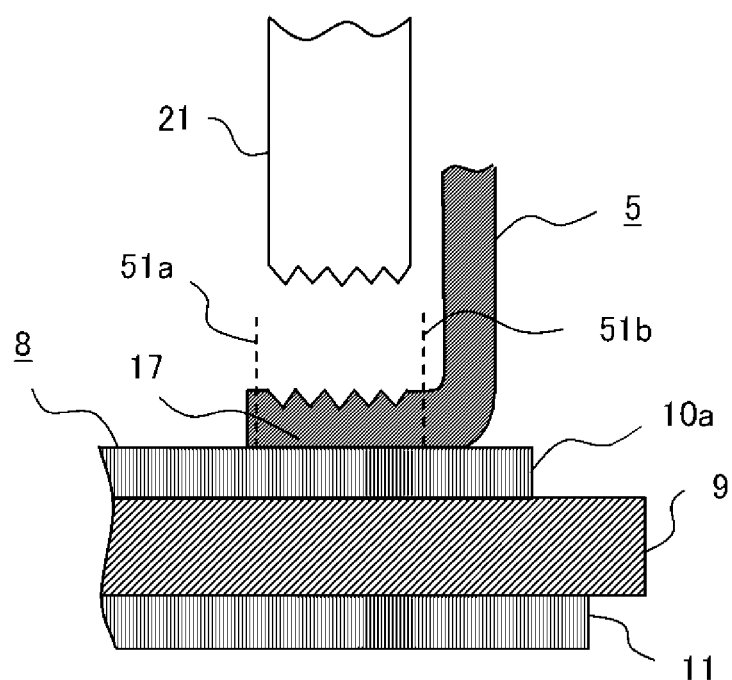
FIG. 6 is an enlarged cross-sectional view of a first ultrasonically-bonded portion in FIG. 5.
Figure 7:
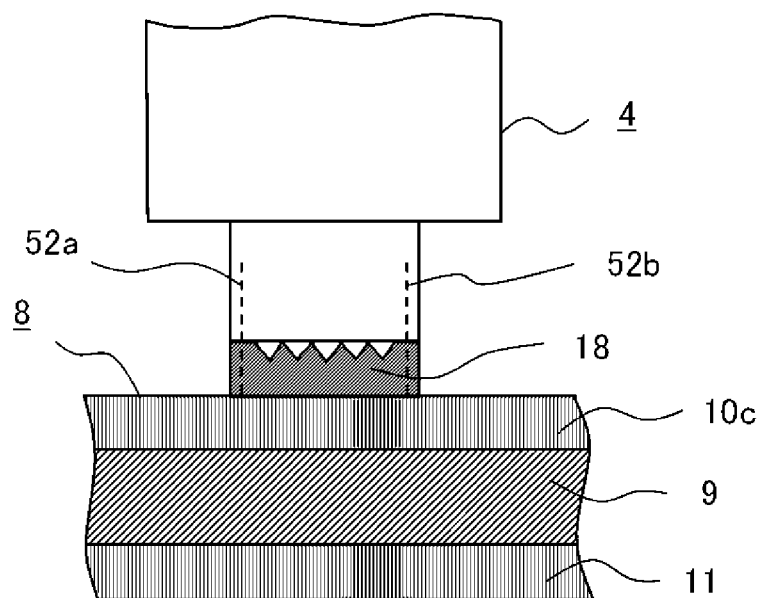
FIG. 7 is an enlarged cross-sectional view of a second ultrasonically-bonded portion in FIG. 5.
Figure 8:
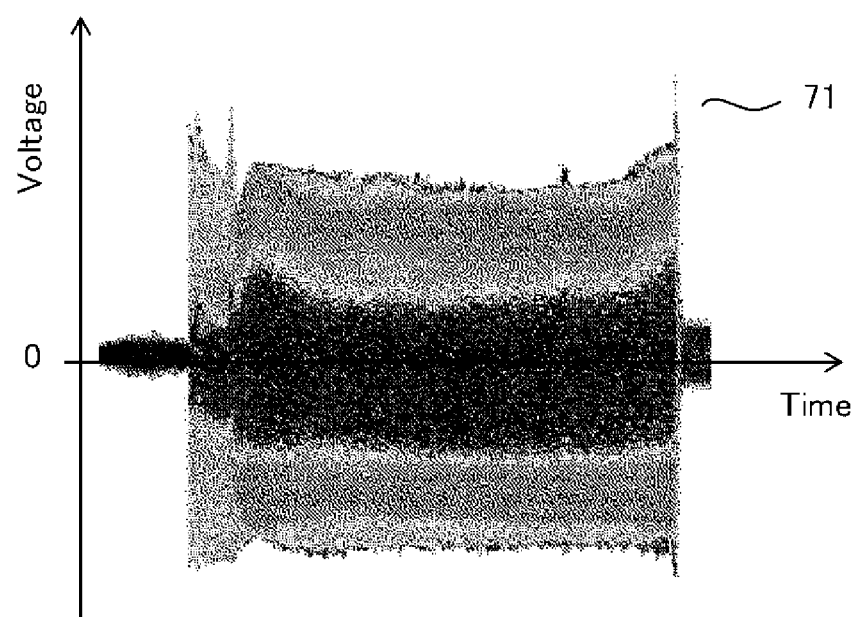
FIG. 8 is a diagram showing an example of an AE signal waveform at the time bonding is non-defective.
Figure 9:
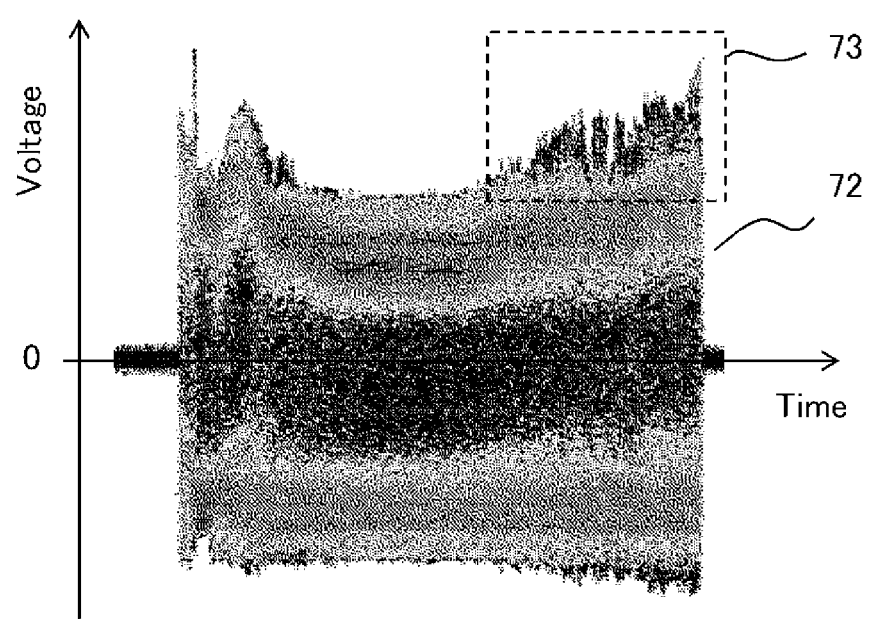
FIG. 9 is a diagram showing an example of an AE signal waveform at the time bonding is defective.
Figure 10:
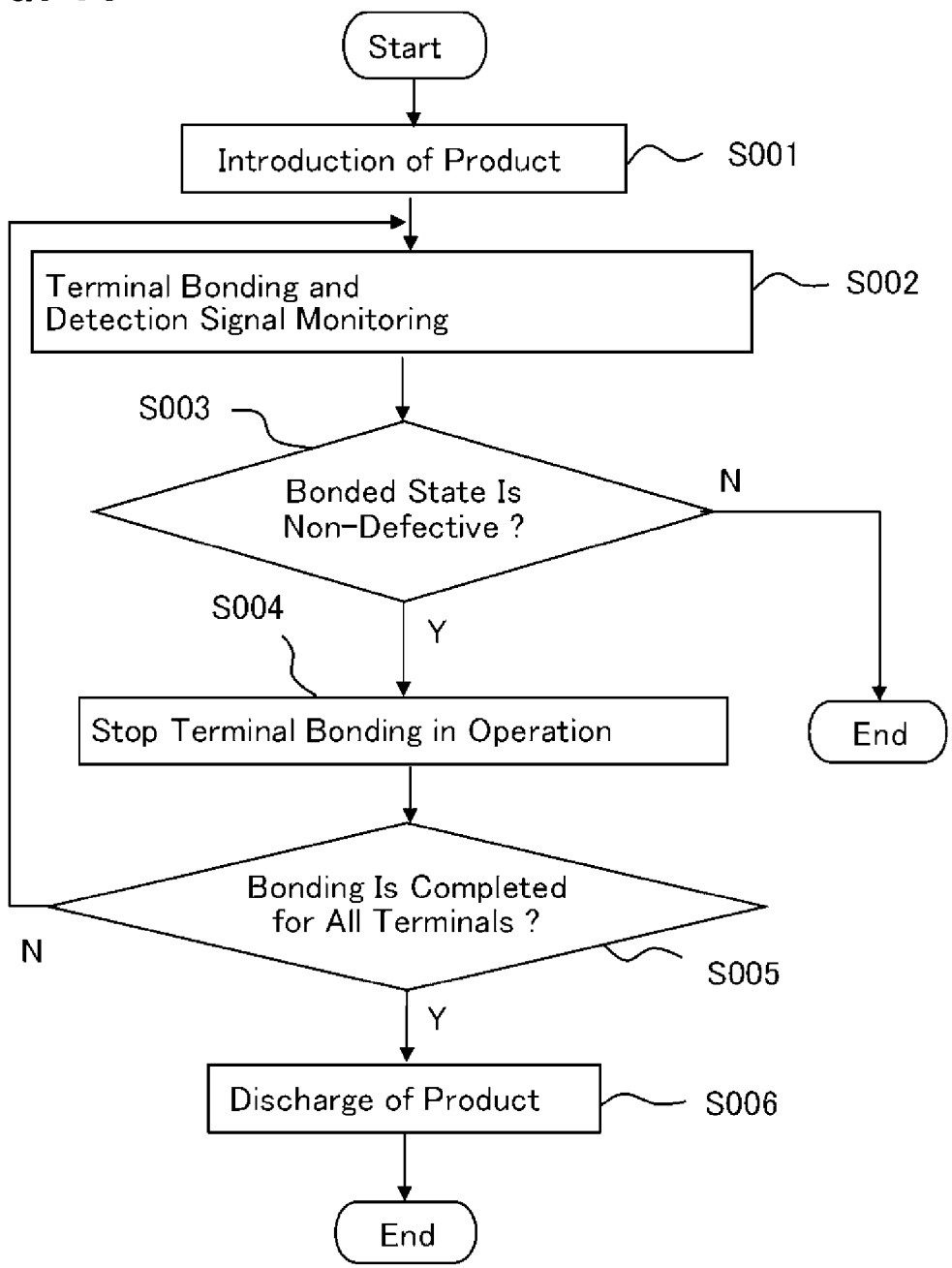
FIG. 10 is a flowchart showing a first example of a bonding process according to Embodiment 1 of the invention.
Figure 11:
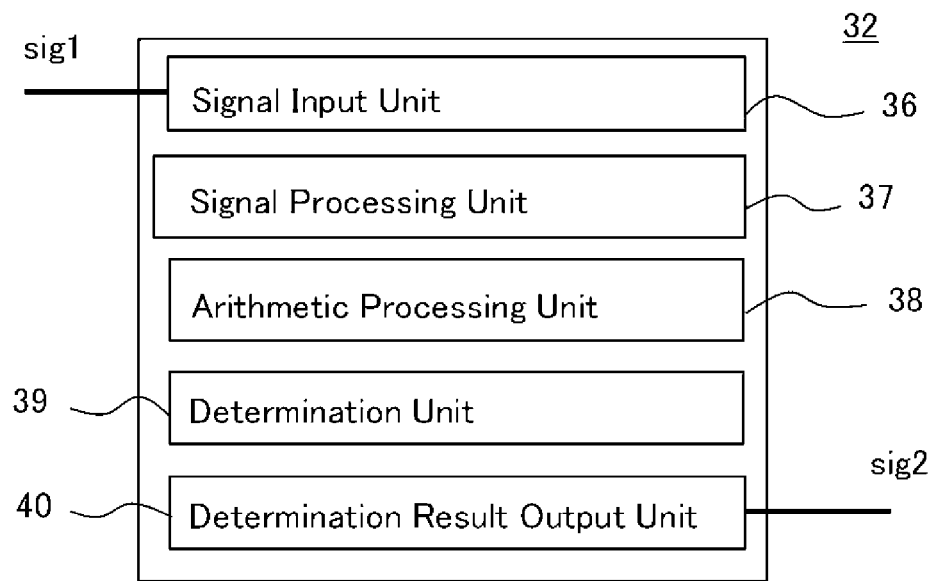
FIG. 11 is a block diagram of another bonded-state determination device in FIG. 1.
Figure 12:
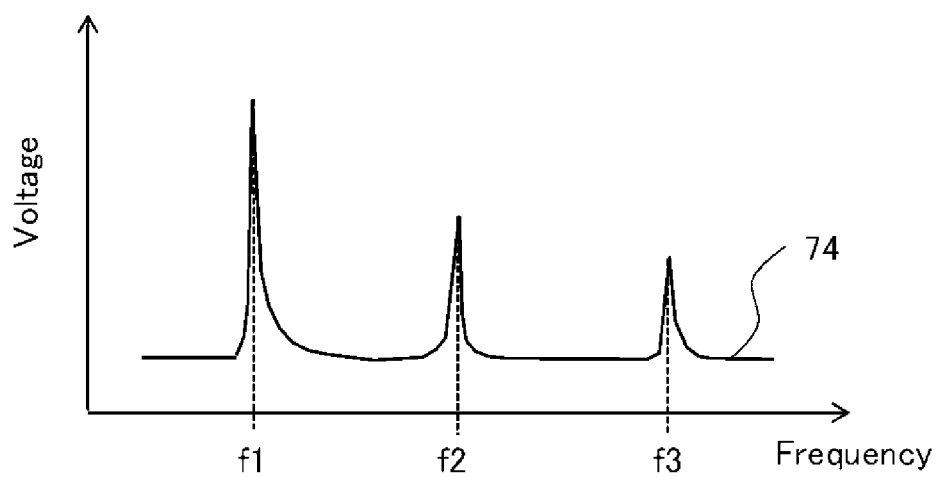
FIG. 12 is a diagram showing an example of an arithmetically-processed waveform at the time bonding is non-defective.
Figure 13:
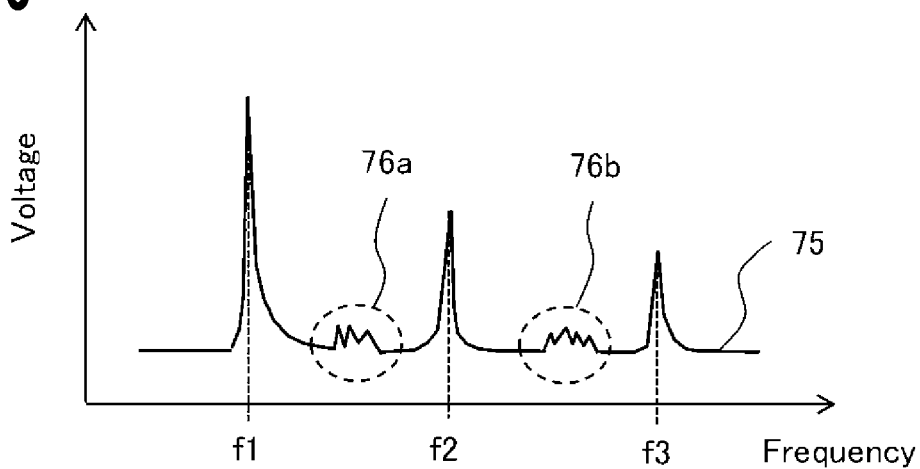
FIG. 13 is a diagram showing an example of an arithmetically-processed waveform at the time bonding is defective.
Figure 14:
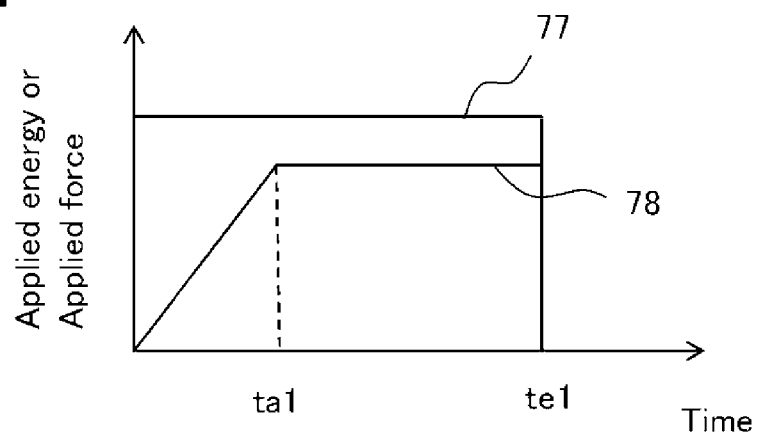
FIG. 14 is a diagram showing a first example of an ultrasonic-wave application condition according to the ultrasonic bonding apparatus of FIG. 1.

FIG. 1 is a diagram showing an ultrasonic bonding apparatus according to Embodiment 1 of the invention, and FIG. 2 is a block diagram of a bonded-state determination device in FIG. 1. FIG. 3 is a top view of a power semiconductor device in FIG. 1, and FIG. 4 is a side view of the power semiconductor device of FIG. 3. FIG. 5 is a cross-sectional view at a section along A-A of the power semiconductor device of FIG. 3. FIG. 6 is an enlarged cross-sectional view of a first ultrasonically-bonded portion in FIG. 5, and FIG. 7 is an enlarged cross-sectional view of a second ultrasonically-bonded portion in FIG. 5. FIG. 8 is a diagram showing an example of an AE signal waveform at the time bonding is non-defective, and FIG. 9 is a diagram showing an example of an AE signal waveform at the time bonding is defective. FIG. 10 is a flowchart showing a first example of a bonding process according to Embodiment 1 of the invention. FIG. 11 is a block diagram of another bonded-state determination device in FIG. 1. FIG. 12 is a diagram showing an example of an arithmetically-processed waveform at the time bonding is non-defective, and FIG. 13 is a diagram showing an example of an arithmetically-processed waveform at the time bonding is defective. FIG. 14 is a diagram showing a first example of an ultrasonic-wave application condition according to the ultrasonic bonding apparatus of FIG. 1.

An ultrasonic bonding apparatus 50 includes an ultrasonic bonding machine 20 for ultrasonically bonding a bonding member to a bonding target member, and a bonding inspection apparatus for inspecting a bonding quality of the bonding member ultrasonically bonded to the bonding target member. The ultrasonic bonding machine 20 includes: a housing 28; a lower jig 24 for mounting thereon a power semiconductor device 1 as a product; upper jigs 25 for fixing the power semiconductor device 1 to the lower jig 24; an ultrasonic oscillator 23 for oscillating an ultrasonic wave; an ultrasonic horn 22 that is a resonator for efficiently transmitting the ultrasonic wave oscillated by the ultrasonic oscillator 23 to an ultrasonic tool 21; the ultrasonic tool 21 for actually applying the ultrasonic wave to the bonding member and the bonding target member; a movable stage 26 for moving the lower jig 24 in an x-direction and a y-direction; an ultrasonic tool moving device 29 for moving the ultrasonic tool 21 in a Z-direction; and an operation terminal 27 that is a control unit for controlling respective instruments in the ultrasonic bonding machine 20. The power semiconductor device 1 is an example of a fixed object fixed to the jig (lower jig 24).

The bonding inspection apparatus 30 includes a bonded-state measuring device 31 for measuring the bonded state of the bonding member ultrasonically bonded to the bonding target member, and a bonded-state determination device 32 for determining a bonding quality of the bonding member and the bonding target member on the basis of a detection signal sig1 containing the bonded state measured by the bonded-state measuring device 31. The bonded-state determination device 32 outputs a determination result signal sig2 to the operation terminal 27. The bonded-state measuring device 31 includes, for example: an AE sensor 33 for detecting as a sound (AE (Acoustic Emission)) a vibration due to the ultrasonic wave transmitted from the ultrasonic tool 21; a pre-amplifier 34 for amplifying the signal of the AE sensor 33; and a measuring device 35 for measuring the signal amplified by the pre-amplifier 34. The measuring device 35 outputs the signal detected by the AE sensor 33, as the detection signal sig1, to the bonded-state determination device 32. Here, the acoustic emission (AE) is that which has a high-frequency component of several kHz to several MHz and propagates mainly in a material. The acoustic emission is suited for use in detection of a high frequency signal that is likely to be attenuated in air. The AE sensor is usually formed of a piezoelectric element, such as PZT (lead zirconate titanate) or the like.

The oscillation frequency of the ultrasonic oscillator 23 and the ultrasonic horn 22 is fixed. Note that the description has been made citing the upper jigs 25 as an example for fixing the power semiconductor device 1; however, the power semiconductor device 1 may be fixed to the lower jig 24 using a screw hole and a screw for attaching the power semiconductor device 1.

First, the power semiconductor device 1 subject to bonding will be described. In the power semiconductor device 1, an IGBT (Insulated Gate Bipolar Transistor) 12 as a power semiconductor element 1 mounted on a circuit board 8, and an FwDi (Free-Wheeling Diode) 13, are enclosed with a resin casing 2 by insert resin molding and a cover 3. In the casing 2, attachment holes 7 for attaching a heatsink (not shown) for dissipating heat during operation are created. Further, upwardly from the upper surface of the power semiconductor device 1, main terminals 4 and signal terminals 5 are formed that are copper terminals for establishing conduction to the outside. The inside of the casing 2 is sealed with a silicone gel 19, and the upper side of the casing 2 is covered with the cover 3. A bush 6 as a metal cylinder is fitted to the inner surface of the attachment hole 7.

The circuit board 8 includes: a 0.32 mm-thick $Si_3N_4$ ceramic plate 9 provided as an insulating material; a 0.7 mm-thick copper wiring pattern 11 for heat dissipation formed on a back surface of the ceramic plate 9; and 0.8 mm-thick copper wiring patterns 10a, 10b, 10c and 10d that are formed on the upper surface of the ceramic plate 9. For that wiring patterns, numeral 10 is used collectively, and numerals 10a, 10b, 10c, 10d are used when they are to be described distinctively. To the wiring pattern 10, the IGBT 12 and the FwDi 13 are bonded using a solder 14. In FIG. 5, an example is shown in which the IGBT 12 and the FwDi 13 are bonded to the wiring pattern 10b. The circuit board 8 and the casing 2 are fixed to each other using an adhesive 16.

To the respective IGBT 12, FwDi 13 and wiring patterns 10, multiple Al connecting wires 15a, 15b and 15c each having a diameter of 200 to 400 μm are connected by wire bonding using ultrasonic bonding. For the connecting wires, numeral 15 is used collectively, and numerals 15a, 15b, 15c are used when they are to be described distinctively. In FIG. 5, an example is shown in which the IGBT 12 and the FwDi 13 are connected to each other by the connecting wire 15b, the wiring pattern 10a and the wiring pattern 10d are connected to each other by the connecting wire 15a, and the wiring pattern 10b and the wiring pattern 10c are connected to each other by the connecting wire 15c. Note that a gate as a control electrode of the IGBT 12 and the wiring pattern 10d are connected to each other by an unshown connecting wire 15. Further, the copper terminals as the bonding members for establishing conduction to the outside, namely, the main terminals 4 and the signal terminals 5, are ultrasonically bonded to the wiring patterns 10 as the bonding target members. The main terminals 4 and the signal terminals 5 each have a plate thickness of 0.8 mm, and the areas of ultrasonically bonded portions 18, 17 connected to the wiring patterns 10 are each provided as a region of 3 mm×5 mm. The main terminals 4 are each a terminal through which a current flows that is larger than that of the signal terminal 5, and are connected to main electrodes of the power semiconductor element, for example, an emitter and a collector that are main electrodes of the IGBT 12. The plate thickness of the wiring patterns 10 is 0.2 to 1.5 mm, and a width of about 1 to 50 mm is generally applied for them.

As shown in FIG. 7, the ultrasonically bonded portion 18 corresponds to a part of the main electrode 4 to be pressed by the ultrasonic tool 21 and is a part between broken lines 52a and 52b. As shown in FIG. 6, the ultrasonically bonded portion 17 corresponds to a part of the signal electrode 5 to be pressed by the ultrasonic tool 21 and is a part between broken lines 51a and 51b.

Using the schematic diagram of FIG. 1, description will be made about the ultrasonic bonding process for the signal terminals 5 as the bonding members and the wiring patterns 10 as the bonding target members. First, using the upper jigs 25, the power semiconductor device 1 is fixed to the lower jig 24 in the ultrasonic bonding apparatus 50. Then, the ultrasonic tool 21 is held against the signal electrode 5 and then, while it is being pressed thereto, ultrasonic vibration is applied on that electrode using the ultrasonic horn 22, so that an oxide film and a stain, formed and adhered around the bonding interface are removed, causing newly developed surfaces to tightly adhere together, to thereby form a bonding layer. The frequency used in the ultrasonic bonding is 10 to 40 kHz, and its amplitude to be applied is 10 to 50 μm as single amplitude. Note that the load during pressing is about several hundreds N, and thus the load is significantly larger than that in the case of an Al wire (connecting wire 15) or an Al tape (at the time of ribbon bonding) whose material strength and size (in particular, its material thickness) are small. In addition, after the bonding, the head of the ultrasonic tool 21 and the signal terminal 5 are put into a state biting into each other, so that their biting is designed to be eliminated in such a manner that, at the time of moving up the ultrasonic tool 21, the ultrasonic tool 21 is moved up while ultrasonic vibration is being applied thereto, so as to allow smooth transition to the bonding of the next signal terminal 5. An ultrasonic bonding condition may include a load, an amount of displacement, energy, a bonding time and the like, and such a condition has been specified beforehand so that an adequate bonding quality will be achieved. Although there is a case where such a condition is set to the same values throughout the bonding, in some cases, the bonding condition is set so that the load will be gradually increased during application of the ultrasonic wave, as shown, for example, in FIG. 14. FIG. 14 is an example of an ultrasonic-wave application condition, in which ultrasonic-wave application energy 77 and an applied force 78 are drawn simultaneously. In FIG. 14, the abscissa represents time, and the ordinate represents the application energy or the applied force. In FIG. 14, an example is shown in which the load is increased until Time ta1, and then a constant load is applied until bonding-finished Time te1 at which the bonding is finished.

The AE sensor 33 is attached to the lower jig 24 in the ultrasonic bonding apparatus 50. The attaching method of the AE sensor 33 desirably uses screw fastening or an adhesive. It is desired that an insert material such as a gel or the like, that allows a sound to pass through easily, be applied between a detection portion of the AE sensor 33 and the lower jig 24.

A method for detecting an AE signal by way of the AE sensor will be described. The AE sensor 33 is connected to the pre-amplifier 34 through a cable, and a signal detected by the AE sensor 33 is amplified by the pre-amplifier 34 and is, thereafter, further amplified by the measuring device (main-amplifier) 35, and is then outputted as the detection signal sig1. The detection signal sig1 is a voltage analog signal. The detection signal sig1 is outputted to the bonded-state determination device 32, and the bonded-state determination device 32 performs numerical arithmetic processing on the voltage itself or voltage signal of the detection signal sig1, to thereby determine whether the bonding quality of the bonding member and the bonding target member is defective or not. The bonded-state determination device 32 includes: a signal input unit 36 for importing the detection signal sig1; a signal processing unit 37 for performing signal processing on the detection signal sig1; a determination unit 39 for determining whether the bonding quality is defective or not; and a determination result output unit 40 for outputting the determination result signal sig2 containing resultant information determined by the determination unit 39. The signal processing unit 37 performs numerical arithmetic processing on the voltage itself or voltage signal of the detection signal sig1. The signal processing unit 37 extracts, for example, a waveform resulting from plotting a positive maximum voltage and a negative maximum voltage at each time in the detection signal sig1, namely, a circumferential shape in FIG. 8 or FIG. 9. It is desired that the AE sensor 33 to be employed can measure a range of frequencies that the ultrasonic horn 22 has.

The ultrasonic bonding apparatus 50 of Embodiment 1 is characterized in that whether the bonding quality is defective or not is determined by the detection of the AE signal at the time of ultrasonic bonding, and that the inspection is performed by the AE sensor 33 attached, not to the product or the ultrasonic horn 22, but to the lower jig 24 of the ultrasonic bonding apparatus (characteristic 1).

The AE signals measured by the bonded-state measuring device 31, namely, the detection signals sig1, are shown in FIG. 8 and FIG. 9. FIG. 8 and FIG. 9 show examples of the AE signal waveform at the time bonding is non-defective and at the time bonding is defective, respectively. In FIG. 8 and FIG. 9, the ordinate represents a voltage, and the abscissa represents time. In FIG. 8 and FIG. 9, the large voltage-amplitude zone corresponds to an AE signal waveform in a state in which the ultrasonic wave is being applied. An AE signal waveform 71 at the time bonding is non-defective is almost constant during application of the ultrasonic wave. In contrast, an AE signal waveform 72 at the time bonding is defective is not constant during application of the ultrasonic wave, and shows higher values at some several spots as shown in a broken-line frame 73.

Using FIG. 10, the bonding process according to Embodiment 1 will be described. In Step S001, product introduction is done. An intermediate product before connection with the main terminals 4 and the signal terminals 5 is introduced into the ultrasonic bonding machine 20 of the ultrasonic bonding apparatus (product introducing step). The intermediate product of the power semiconductor device 1 to be introduced into the ultrasonic bonding machine 20 is without the cover 3, the silicone gel 19, the main terminals 4 and the signal terminals 5. Specifically, the intermediate product of the power semiconductor device 1 is mounted on the lower jig 24 and fixed the jig 24 using the upper jigs 25. In Step S002, a first terminal, for example, the upper right signal terminal 5 in FIG. 3, is subjected to ultrasonic bonding and the detection signal sig1 is monitored by the bonded-state measuring device 31 (detection signal monitoring step).

In Step S003, based on the detection signal sig1, the bonded-state determination device 32 determines the bonded state between the first terminal (signal terminal 5) as the bonding member and the wiring pattern 10 as the bonding target member (bonded-state determination step). When, in Step S003, the bonded state is determined to be non-defective, the flow moves to Step S004, whereas when the bonded state is determined to be defective (bad), the flow terminates. In Step S004, the terminal bonding in operation is stopped (ultrasonic-wave application stopping step), and then the flow moves to Step S005. In Step S004, the application of the ultrasonic wave in the bonding condition and the pressing of the ultrasonic tool 21, for the terminal in operation, are stopped. Specifically, the ultrasonic tool 21 is moved so as to be released from the terminal in operation, for example, it is moved up. At the time the ultrasonic tool 21 is moved up, application of an ultrasonic wave in a releasing condition for eliminating the biting with the terminal (signal terminal 5) is performed. The ultrasonic wave in the releasing condition has energy lower than that of an ultrasonic wave, for example, in the bonding condition.

In Step S005, it is determined whether or not bonding has been completed for all terminals. When it is determined in Step S005 that a terminal to be bonded as the bonding member still remains, namely, bonding has not been completed, the flow returns to Step S002, whereas when it is determined that the terminal to be bonded does not remain, namely, bonding has been completed for all terminals, the flow moves to Step S006. In the example shown in FIG. 3, seven terminals are provided, so that Steps S002 to S005 are executed seven times. The seven terminals are the four signal terminals 5 and the three main terminals 4. In Step S006, the product is discharged (product discharging step), so that the flow terminates. In Step S006, the upper jigs 25 are removed and the intermediate product of the power semiconductor device 1 is discharged from the ultrasonic bonding machine 20. When the bonding process for the intermediate product of one power semiconductor device 1 has been completed, the bonding process for an intermediate product of the next power semiconductor device 1 is executed.

The bonded-state determination device 32 performs the bonded-state determination step on the basis of the detection signal sig1 outputted by the bonded-state measuring device 31 in the detection signal monitoring step. The bonded-state determination device 32 imports the detection signal sig1 using the signal input unit 36, and performs pre-processing before determination on the detection signal sig1 provided in the detection signal monitoring step, by executing signal processing on the detection signal sig1, for example, by extracting the circumferential shape, using the signal processing unit 37. The determination unit 39 determines whether or not a high voltage value emerges in the circumferential shape of the waveform of the detection signal sig1 (detection waveform) as shown in the broken-line frame 73 in FIG. 9. When a high voltage value emerges in the circumferential shape of the waveform of the detection signal sig1 as shown in the broken-line frame 73 in FIG. 9, namely, when unusual information is detected that is not associated with a reference waveform and that indicates emergence of a high voltage value, or the like, the bonding is determined to be defective; and when a high voltage value as shown in the broken-line frame 73 in FIG. 9 does not emerge in the circumferential shape of the waveform of the detection signal sig1, namely, when unusual information is not detected that is not associated with the reference waveform and that indicates emergence of a high voltage value, or the like, the bonding is determined to be non-defective. The determination result output unit 40 outputs the determination result signal sig2 containing resultant information indicative of the determination result determined by the determination unit 39.

A waveform as a reference for the detection signal sig1 (waveform of a reference detection signal, or reference waveform) that is to be used in the bonded-state determination step at the time of determining whether the bonded state is defective or not, is:

a waveform of the detection signal sig1 which was measured beforehand by the bonded-state measuring device 31 when a bonding process was executed beforehand in an ultrasonic bonding condition for bonding the bonding target member (wiring pattern 10) and the bonding member (main terminal 4, signal terminal 5) together and whereby a bonded state corresponding to the bonding target member (wiring pattern 10) and the bonding member (main terminal 4, signal terminal 5) was determined to be non-defective; or its pre-processed waveform obtained by the extraction of the circumferential shape, or the like.

The AE signal waveform 71 at the time bonding is non-defective, which was acquired when the bonding process was executed beforehand, is the waveform of the reference detection signal (reference waveform). The AE signal waveform 71 at the time bonding is non-defective or the AE signal waveform 72 at the time bonding is defective, which is detected at the time the bonded state is determined to be defective or not, is a waveform of the detection signal subject to determination in the bonded-state determination step.

The reason why the characteristic 1 aforementioned is employed will be described. According to the bonding inspection method of Patent Document 1, since an AE signal is detected in the atmosphere through an air layer from the bonded portion, a problem resides in noise due to the intermediation of the air layer, even if a soft material that easily allows signal transmission, such as a silicone rubber, a resin sheet or the like, is placed on the head of the AE sensor. Further, in a production site, a facility for use in another process is also placed in the same room and thus, a sound or vibration (environmental noise) occurs due to that facility, so that such a sound or vibration will propagate in the atmosphere to thereby create large noise for the AE signal to be detected by the AE sensor. Thus, according to the bonding inspection method of Patent Document 1, since the large noise is superimposed on the AE signal, it is unusable in a usual production site. Unlike the bonding inspection method of Patent Document 1, according to the ultrasonic bonding apparatus 50 of Embodiment 1, since the AE sensor 33 is attached onto the lower jig 24, there is no such a sound or vibration intruding through an air layer toward the detection surface of the AE sensor 33 and accordingly, the noise that occurs by the bonding inspection method of Patent Document 1 will not be detected by the AE sensor 33. Namely, according to the ultrasonic bonding apparatus 50 of Embodiment 1, since environmental noise is less likely to intrude, it is possible to detect the AE signal, highly accurately.

In order to further reduce noise in the AE signal to the minimum, it is effective to use the AE sensor 33 that can detect the frequencies corresponding to the ultrasonic horn 22 and does not detect frequencies where noise occurs, and thus that is usable in a specific frequency range(s).

Further, the bonding inspection method of Patent Document 1 is a method in which the AE sensor is placed in proximity to a semiconductor chip, to thereby detect the AE signal. When the bonding inspection method of Patent Document 1 is used, many problems to be solved arise as described below. With the use of this method, there are cases where, when the AE sensor is used repetitively, a foreign substance adheres to that AE sensor. Further, if the AE sensor is attached in the product, a possibility arises that the foreign substance falls down to thereby affect the property. Further, when the AE signal is to be detected individually in the products, attachment and detachment of the AE sensor (translation of the AE sensor) are required for every product, and this creates a problem that the inspection time including time for the attachment and detachment becomes longer than the ultrasonic bonding time. Furthermore, when the AE signal is to be acquired while reducing noise as much as possible, since the gap between the measuring object and the AE sensor is desired to be small, the gap between the measuring object and the AE sensor 33 is generally filled with a gel or adhesive. However, when the gel or adhesive adheres to the product, a possibility arises that the product can not exert an intended property. Further, when the AE signal is acquired in such a manner that the AE sensor is made contact with the semiconductor chip (semiconductor element), there is also a problem that the AE sensor and the semiconductor chip cause friction at their interface due to the application energy during ultrasonic bonding, and this friction becomes a noise factor. According to the bonding inspection method of Patent Document 1, such problems arise, so that the AE sensor is desired to be attached at a place other than the product at which the vibration during ultrasonic bonding is less influential than otherwise. In particular, as shown in FIG. 1, it is desired to be attached to the lower jig 24 on which the product is fixed and which provides a position where higher signal-detection accuracy can be achieved.

As a method for performing inspection without making contact with the product, temperature measurement using thermography, like that using an infrared camera shown in FIG. 3 in Patent Document 1, is conceivable as a possibility. However, because of dealing with large current, the power semiconductor device 1 is designed to efficiently dissipate heat. Thus, heat at the ultrasonic bonding will be dissipated during that bonding, so that the accuracy is poor according to such temperature-based inspection. Further, the terminal shape of the power semiconductor device 1 is generally different for each terminal, so that an amount of dissipated heat is different for each terminal. Accordingly, a temperature difference depending on the terminal shape becomes larger than the difference depending on the bonding quality, and thus such temperature-based inspection is not adequate also in this viewpoint. Furthermore, the inside of the power semiconductor device 1 is surrounded by the casing 2 and in that inside, the wiring patterns 10 and the connecting wires 15 are complexly connected to the terminals, so that heat is easily dissipated. For this reason, there is also a problem that it is difficult to confirm the temperature of the terminal bonded portion (ultrasonically bonded portion 17, 18) directly by a thermo-viewer.

Further, regarding the position at which the AE sensor is to be attached, if it is outside the product (power semiconductor device 1), the ultrasonic tool 21 may also be nominated therefor. However, when the AE sensor 33 is attached onto the ultrasonic tool 21, a state of vibration caused by oscillation from the ultrasonic horn 22 varies by the self-weight of the AE sensor 33, so that attenuation occurs due to the self weight of the AE sensor 33, for example. Thus, this is not appropriate. Furthermore, at the ultrasonic bonding of the terminal (main terminal 4, signal terminal 5), a very large amplitude is given to the terminal, and thus there is also a problem that the attached AE sensor 33 may be removed.

Further, with respect, in particular, to the case where a fixed state between the terminal (main terminal 4, signal terminal 5) and the wiring pattern 10 is to be detected, in the AE signal by the AE sensor 33 placed on the ultrasonic tool 21, a signal component mainly from the ultrasonic horn 22 becomes large, so that a signal component from the ultrasonically bonded portion 17, 18 becomes relatively small. For the detection of the signal component from the ultrasonically bonded portion 17, 18, when the AE signal by the AE sensor 33 placed on the fixing jig (lower jig 24) is detected, higher accuracy will be provided.

It is noted that the material of the jig 24 is desired to easily allow transmission of the AE signal, not to deform by the load during ultrasonic bonding, and to be less thermally deteriorated during the bonding. When a resin or ceramic material is used, there is a problem that the signal may be attenuated due to deterioration caused by the pressing force or the distance from an AE-signal acoustic source to the AE sensor 33. As the material of the lower jig 24, it is desired not to use a resin material, etc. but to use a metallic material such as stainless steel, aluminum alloy, or the like. The material of the lower jig 24 may also be defined using a sound velocity. Namely, a material by which a sound velocity of the ultrasonic wave propagating in the lower jig 24 is 3000 m/s or more, transmits the AE signal more easily, and is thus suited as the material of the lower jig 24.

The ultrasonic bonding apparatus 50 of Embodiment 1 inspects non-destructively the bonded state between the bonding target member (wiring pattern 10) and the bonding member (main terminal 4, signal terminal 5), and thus has a feature capable of making the inspection time shorter than that in the case where sampled products are destructively inspected. Further, after completion of the bonding, the application of an ultrasonic wave only for inspecting whether bonding is defective or not, as in the bonding inspection method of Patent Document 1, is unnecessary, so that the ultrasonic bonding apparatus 50 of Embodiment 1 has a feature in that such an additional time required for inspecting the bonded state does not arise. Further, according to the ultrasonic bonding apparatus 50 of Embodiment 1, because the AE signal at the time of ultrasonic bonding is detected, it is possible not to be affected by a variation at the time of application of the ultrasonic wave for inspection (unevenness of an ultrasonic-wave applied portion, a foreign substance, abrasion or cracking of the ultrasonic tool, or the like) that is problematic in the bonding inspection method of Patent Document 1.

Furthermore, according to the ultrasonic bonding apparatus 50 of Embodiment 1, whether the bonding is defective or not can be determined in the bonding process, so that, if a bonding defect should occur at a certain bonding spot, namely, if the bonded state should be determined to be defective in the bonded-state determination step, it is allowed to perform abandonment, or repairing of the bonding defect to be described later. Thus, according to the ultrasonic bonding apparatus 50 of Embodiment 1, such a situation can be prevented where, despite a defective product, the manufacturing process proceeds to the next or following step making it unable to perform repairing of the bonding defect; and thus unnecessary manufacturing time that would have continued accordingly can be eliminated. As the result, it is possible to prevent unnecessary cost from being generated. In the case of incomplete bonding, when the defect is, for example, due to lack of bonded area, repairing of the bonding defect is done by an additional pressing and ultrasonic wave application, or the like.

Further, the ultrasonic bonding apparatus 50 of Embodiment 1 can store the number of bonding members with which the bonded state is determined to be defective, namely, defect-inspected number, to thereby recognize the state of the ultrasonic bonding apparatus 50 by using the defect-inspected number. For example, when defect-inspected numbers are sorted by number of products, date manufactured or the like, it is possible, after confirming the transition of the defect-inspected number, to take maintenance of the apparatus when the defect-inspected number exceeds a preset determination value. This also leads to preventing occurrence of the bonding defect.

According to the ultrasonic bonding apparatus 50 of Embodiment 1, when a silicone rubber layer that does not easily allow transmission of the AE signal is provided under the lower jig 24 (between the lower jig 24 and the movable stage 26) or/and under the facility (between the ultrasonic bonding machine 20 and the floor on which that machine is placed), it is possible to further reduce noise generated from the other facility in the room in which the ultrasonic bonding machine 50 is placed, thus making it possible to detect whether bonding is defective or not, more highly accurately.

Furthermore, when a detection signal sig1 containing a value at a specific frequency is generated through numerical arithmetic processing, for example, an FFT (Fast Fourier Transform), on the AE signals detected by the bonded-state measuring device 31, namely, on the AE signal waveform 71, 72, it is possible to perform high-level determination as to whether the bonded state is defective or not, in the bonded-state determination device 32. FIG. 11 shows a bonded-state determination device 32 that performs numerical arithmetic processing on the AE signals detected by the bonded-state measuring device 31, namely, on the AE signal waveform 71, 72. The bonded-state determination device 32 of FIG. 11 results from adding an arithmetic processing unit 38 to the configuration of the bonded-state determination device 32 of FIG. 2. The operations of the signal input unit 36, the signal processing unit 37 and the determination result output unit 40 in this bonded-state determination device 32 are similar to those in the bonded-state determination device 32 of FIG. 2. The arithmetic processing unit 38 performs numerical arithmetic processing, such as FFT or the like, on a signal processed by the signal processing unit 37 from the detection signal sig1. The operation of the determination unit 39 will be described later.

FIG. 12 shows an example of an arithmetically-processed waveform at the time bonding is non-defective, which is an arithmetically-processed waveform obtained through numerical arithmetic processing from the AE signal waveform at the time bonding is non-defective in FIG. 8. FIG. 13 shows an example of an arithmetically-processed waveform at the time bonding is defective, which is an arithmetically-processed waveform obtained through numerical arithmetic processing from the AE signal waveform at the time bonding is defective in FIG. 9. In FIG. 12 and FIG. 13, the ordinate represents a voltage, and the abscissa represents a frequency.

As shown in FIG. 12, in an arithmetically-processed waveform 74 at the time bonding is non-defective, respective components at a frequency f1 that is the same as a frequency of the ultrasonic horn 22, at a frequency f2 that is twice said frequency, and at a frequency f3 that is triple said frequency, are found. In contrast, as shown in FIG. 13, in an arithmetically-processed waveform 75 at the time bonding is defective, in addition to the components at the frequency f1 that is the same as the frequency of the ultrasonic horn 22 and at the frequencies that are natural number times said frequency, other frequency components are found. The other frequency components are components indicated in broken-line circles 76a, 76b. These frequency components, that are found at frequencies other than the frequency of the ultrasonic horn 22 and the frequencies that are natural number times said frequency, are frequency components of AE signals generated, for example, when the back surface of the product (power semiconductor device 1) and the jig (lower jig 24, upper jig 25) cause friction with each other in a situation where fixing of the product to the jig is loosened by the vibration at the time of ultrasonic bonding, or fixing of the product to the jig is loosened in a case where the product has a large warpage or a case like that. Namely, when the voltage value of AE signal that has been found in a frequency band other than the frequency of the ultrasonic horn 22 and the frequencies that are natural number times said frequency, is converted into a numerical value, and a threshold value therefor is set, it is possible to determine whether defective or not (first determination on arithmetically processed waveform). As the threshold value, such a numerical value is set by which, when a waveform obtained through numerical arithmetic processing from the waveform of the reference detection signal previously described (arithmetically-processed reference waveform) and the arithmetically-processed waveform subject to the determination are compared with each other, unusual information not found in the arithmetically-processed reference waveform can be detected.

Further, a second determination on arithmetically processed waveform may be performed that is different from the first determination on arithmetically processed waveform. As compared with the arithmetically-processed waveform 74 at the time bonding is non-defective, in the arithmetically-processed waveform 75 at the time bonding is defective, differences emerge in the voltage values of AE signal that are found at the frequency that is the same as the frequency of the ultrasonic horn 22 and the frequencies that are natural number times said frequency. For example, when fixing of the product to the jig is loose, the AE signal will be that in which an AE signal generated at the time the back surface of the product and the jig cause friction with each other, is superimposed. When the fixing is loose, the voltage values of AE signal found at the frequency that is the same as the frequency of the ultrasonic horn 22 and the frequencies that are natural number times said frequency, become lower. Namely, when the voltage values of AE signal that have been found in frequency bands matching with the frequency of the ultrasonic horn 22 and the frequencies that are natural number times said frequency, are converted into numerical values, and a threshold value therefor is set, it is possible to determine whether defective or not. As the threshold value, such a numerical value is set by which, when the waveform obtained through numerical arithmetic processing from the waveform of the reference detection signal previously described (arithmetically-processed reference waveform) and the arithmetically-processed waveform subject to the determination are compared with each other, unusual information not found in the arithmetically-processed reference waveform can be detected.

In the case of performing the second determination on arithmetically processed waveform, the determination may be performed only based on an AE signal detected in a frequency band matching with the frequency of the ultrasonic horn 22. When the determination is performed only based on the AE signal detected in a frequency band where the voltage-value deference between when the bonding is non-defective and when the bonding is defective is largest, it is possible to adequately determine whether defective or not. Because the voltage value of AE signal detected in a frequency band matching with the frequency f1 of the ultrasonic horn 22 will vary most significantly, even when the determination is performed only based on the AE signal detected in that frequency band, it is possible to adequately determine whether defective or not.

In the first determination on arithmetically processed waveform and the second determination on arithmetically processed waveform, since their respective threshold values for distinguishing between defectiveness and non-defectiveness of the bonded state, are each set with reference to the waveform obtained through numerical arithmetic processing from the waveform of the reference detection signal previously described. Thus, the numerical arithmetic waveform obtained through numerical arithmetic processing from the waveform of the reference detection signal can also be said to be a numerical arithmetically-processed waveform as a reference for the detection signal sig1 (arithmetically-processed reference waveform) to be used when the first determination on arithmetically processed waveform or second determination on arithmetically processed waveform is performed. The arithmetically-processed waveform 74 which is a waveform obtained through numerical arithmetic processing from the AE signal waveform 71 at the time bonding is non-defective that was acquired when a bonding process was executed beforehand, is the arithmetically-processed reference waveform. The arithmetically-processed waveform 74 obtained through numerical arithmetic processing from the AE signal waveform 71 at the time bonding is non-defective or the arithmetically-processed waveform 75 obtained through numerical arithmetic processing from the AE signal waveform 72 at the time bonding is defective, that is detected at the time of determining whether the bonded state is defective or not, is an arithmetically-processed waveform subject to the determination in the bonded-state determination step.

In the case where the bonded-state determination step is executed using the arithmetically-processed waveforms 74, 75, the bonded-state determination device 32 operates as follows. The bonded-state determination device 32 determines the bonded state between the bonding target member (wiring pattern 10) and the bonding member (main terminal 4, signal terminal 5) on the basis of:

the arithmetically-processed reference waveform (previously-measured arithmetically-processed waveform 74) obtained through numerical arithmetic processing from the waveform of the reference detection signal which was measured beforehand by the bonded-state measuring device 31 (previously-measured AE signal waveform 71) when a bonding process was executed beforehand in an ultrasonic bonding condition for bonding the bonding target member (wiring pattern 10) and the bonding member (main terminal 4, signal terminal 5) together and whereby a bonded state corresponding to the bonding target member (wiring pattern 10) and the bonding member (main terminal 4, signal terminal 5) was determined to be non-defective; and the arithmetically-processed waveform (current arithmetically-processed waveform 74, 75) obtained through numerical arithmetic processing from the waveform of the detection signal sig1 (current AE signal waveform 71, 72) measured by the bonded-state measuring device 31 in the bonding process.

According to the ultrasonic bonding apparatus 50 of Embodiment 1, by applying FFT analysis in the bonded-state determination device 32 on the detected AE signals, it is possible to differentiate an AE signal based on the bonded portion and an AE signal due to weakly fixed product, and thus, in addition to determining whether the bonded state between the bonding member and the bonding target member is defective or not, it is possible to recognize the reason therefor. Note that plural factors are assumed to cause loosening of the product fixed to the jig and, for example, such a case is conceivable where, when the product is fixed using a screw, a gap due to the influence of warpage of the product emerges beneath the screw fixing portion and between the product and the lower jig 24, so that the screw is loosened by the vibration during ultrasonic bonding.

In order to differentiate the fixing-related AE signal and the bonding-related AE signal, such a method is useful in which they are differentiated based on a frequency difference. As such a frequency-based differentiation method, there is a method of performing FFT analysis on a signal waveform measured using a single AE sensor 33 to thereby differentiate the frequency components, or a method of using multiple AE sensors 33 which are each high in detection accuracy at a specific frequency to thereby differentiate the signals detected by the respective AE sensors 33 according to their magnitudes.

Figure 15:
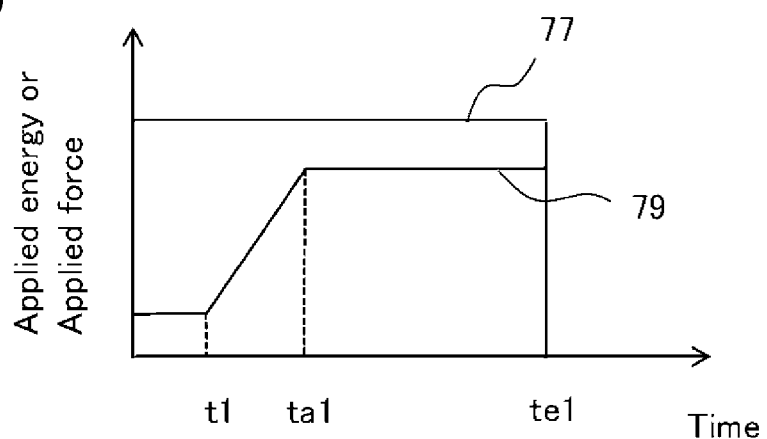
FIG. 15 is a diagram showing a second example of the ultrasonic-wave application condition according to the ultrasonic bonding apparatus of FIG. 1.

The bonding condition for the bonding target member and the bonding member may be other than the ultrasonic-wave application condition shown in FIG. 14. For example, as shown in FIG. 15, the bonding condition for the terminal (main terminal 4, signal terminal 5) may be set to have steps. FIG. 15 is a diagram showing a second example of the ultrasonic-wave application condition according to the ultrasonic bonding apparatus of FIG. 1. In FIG. 15, the abscissa represents time, and the ordinate represents the application energy or the applied force. In FIG. 15, ultrasonic-wave application energy 77 and an applied force 79 are drawn simultaneously. In FIG. 15, an example is shown in which a weak load is applied until Time t1 and thereafter, the load is gradually increased until Time ta1, and then a constant load is applied until bonding-finished Time te1 at which the bonding is finished. When the bonding condition for the terminal (main terminal 4, signal terminal 5) is set to have the steps, and inspection is performed on the AE signals obtained in an initial period of ultrasonic-wave application until Time t1 in which the ultrasonic wave is applied with the weak load that does not promote the bonding, a following effect will be exerted. It is possible to detect friction between the bonding member (main terminal 4, signal terminal 5) and the bonding target member (wiring pattern 10) from the AE signals just before the initiation of bonding, namely, the AE signals obtained until Time t1, so that a surface state (unevenness, a foreign substance) at the bonding interface, abrasion or cracking of the ultrasonic tool 21, and the like, can be inspected before the bonding.

Further, the inspection result, namely, the determination result of the bonded state, may also be fed back to the ultrasonic bonding apparatus 50. Feeding back the determination result of the bonded state to the ultrasonic bonding apparatus 50 makes it possible to increase the bonding time when, for example, the bonded area has not reached its target, to decrease the bonding time when the bonded area has reached the target, and to properly adjust the bonding condition according to the determination result of the bonded state. Accordingly, a constant bonding quality can be achieved. Furthermore, when bonding processing is stopped just after the bonding is completed, unnecessary energy is eliminated from being applied to the product. This suppresses the heat during bonding from traveling through the copper wiring pattern 10 or/and the terminal (main terminal 4, signal terminal 5) to cause thermal damage to a member therearound, in the case of ultrasonic bonding in which large load is applied. Further, this suppresses the damage, etc. of the wiring pattern 10 and the terminal (main terminal 4, signal terminal 5).

Figure 16:
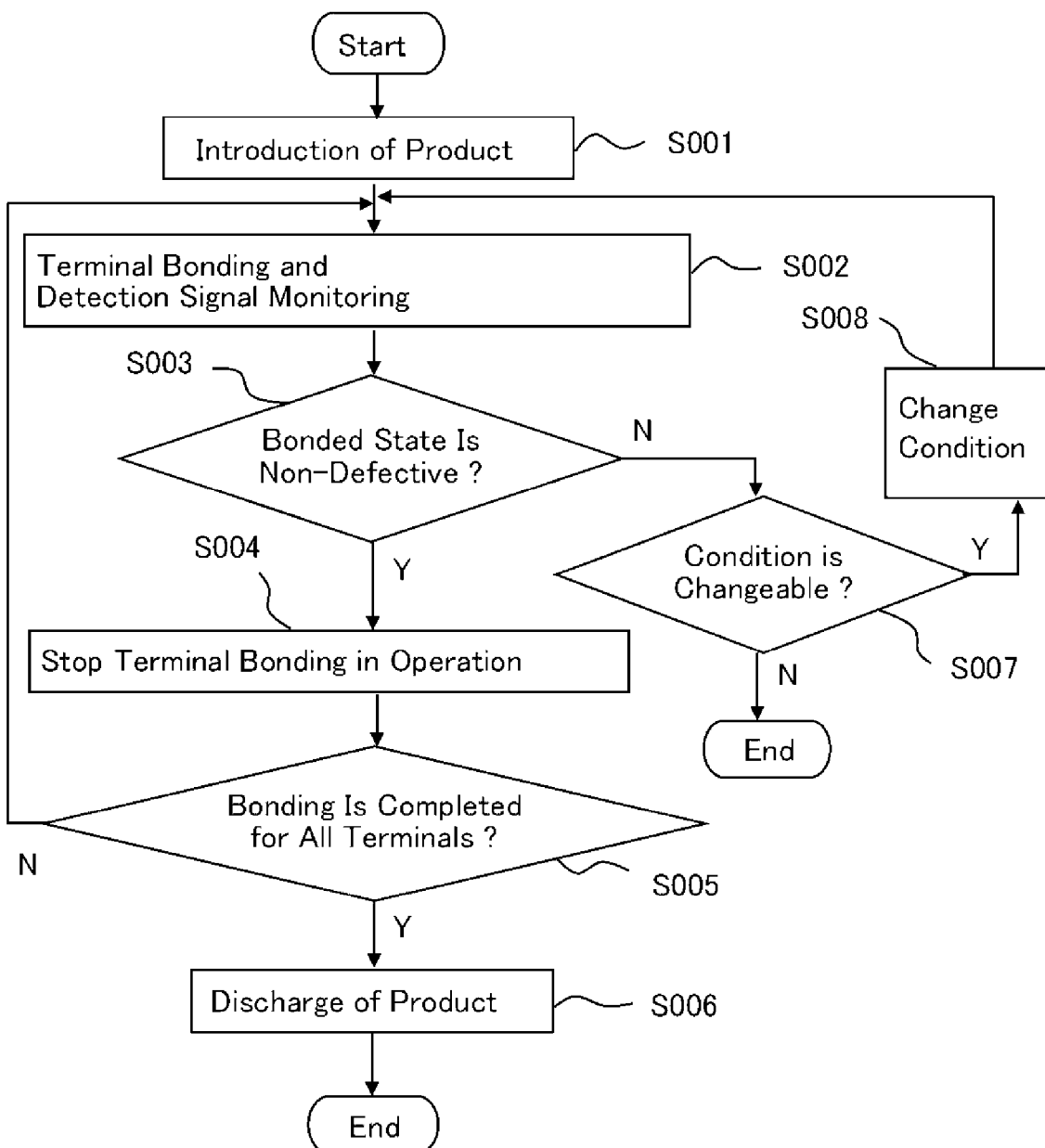
FIG. 16 is a flowchart showing a second example of the bonding process according to Embodiment 1 of the invention.
Figure 17:
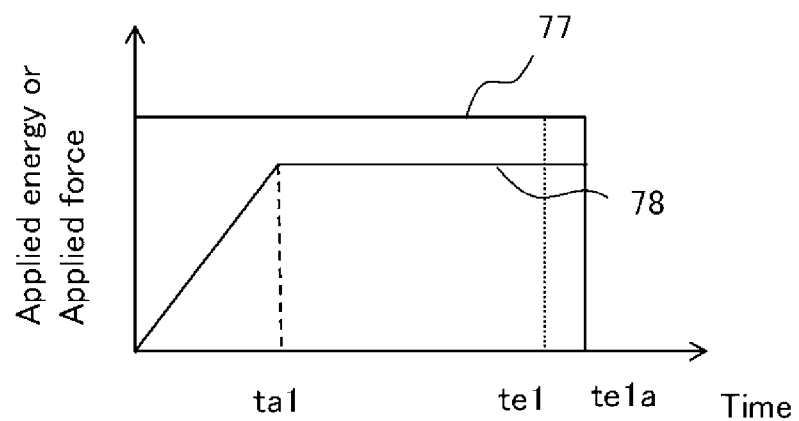
FIG. 17 is a diagram showing a third example of the ultrasonic-wave application condition according to the ultrasonic bonding apparatus of FIG. 1.
Figure 18:
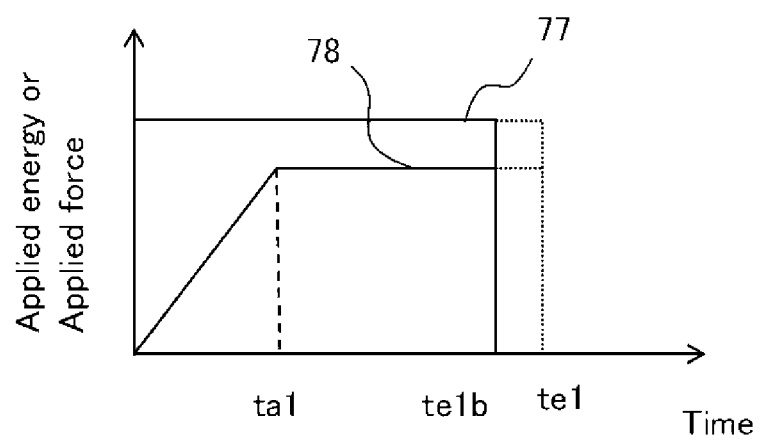
FIG. 18 is a diagram showing a fourth example of the ultrasonic-wave application condition according to the ultrasonic bonding apparatus of FIG. 1.

FIG. 16 is a flowchart showing a second example of the bonding process according to Embodiment 1 of the invention. FIG. 17 is a diagram showing a third example of the ultrasonic-wave application condition according to the ultrasonic bonding apparatus of FIG. 1. FIG. 18 is a diagram showing a fourth example of the ultrasonic-wave application condition according to the ultrasonic bonding apparatus of FIG. 1. The flowchart shown in FIG. 16 is an example resulting from adding Steps S007 and S008 to the flowchart of FIG. 10 so that the determination result of the bonded state is fed back. Description will be made about portions other than those in the flowchart of FIG. 10.

The bonded-state determination step as Step S003 is executed at plural timings given between a time earlier than a planned bonding-finished time and a maximum time up to which the condition is changeable. Note that there are also cases where the bonded state is determined to be non-defective at the first timing of executing the determination.

In Step S003, based on the detection signal sig1, the bonded-state determination device 32 determines the bonded state between the first terminal (signal terminal 5) as the bonding member and the wiring pattern 10 as the bonding target member (bonded-state determination step). When, in Step S003, the bonded state is determined to be non-defective, the flow moves to Step S004. When, in Step S003, the bonded state is determined to be defective (bad), the flow moves to Step S007. In Step S007, whether the condition is changeable or not is determined (bonding condition determination step), and when it is determined to be changeable, the bonding condition is changed in Step S008 (bonding condition changing step), and then the flow returns to Step S002. When the condition is determined to be not changeable in Step S007, the flow terminates (defective bonding terminating step). Note that when the bonding condition changing step as Step S008 has been executed, the detection signal monitoring step as Step S002 and the bonded-state determination step as Step S003 to be executed in the ultrasonic bonding condition changed in the bonding condition changing step, correspond to a bonding continuing step. The ultrasonic-wave application stopping step as Step S004 is also a non-defective bonding stopping step in which, when the bonded state between the bonding target member (wiring pattern 10) and the bonding member (main terminal 4, signal terminal 5) is determined to be non-defective in the bonded-state determination step as Step S003, the bonding process in operation for the bonding target member and the bonding member is stopped.

Description will be made about a case where the bonding condition to be changed is a bonding time, for example. In Step S007, it is determined whether the maximum time up to which the condition is changeable is reached or not. Specifically, if the maximum time is not reached, the condition is determined to be changeable, whereas if the maximum time is reached, the condition is determined to be not changeable. FIG. 17 is an example in which the bonding time is extended up to a time later than the planned bonding-finished time, and FIG. 18 is an example in which the bonding is finished at a time earlier than the planned bonding-finished time. In FIG. 17 and FIG. 18, the abscissa represents time, and the ordinate represents the application energy or the applied force. In FIG. 17 and FIG. 18, ultrasonic-wave application energy 77 and an applied force 78 are drawn simultaneously. Time te1 represents the planned bonding-finished time. Time te1a represents a bonding-finished time after extension, and Time te1b represents a bonding-finished time after shortening. As shown in FIG. 18, when the flow moves to Step S004 at a time earlier than the planned bonding-finished time (Time te1), the bonding time becomes shorter, and as shown in FIG. 17, when the flow moves to Step S004 at a time later than the planned bonding-finished time (Time te1), the bonding time becomes longer. In this manner, according to the ultrasonic bonding apparatus 50 of Embodiment 1 in which the determination result of the bonded state is fed back, the bonding condition can be adjusted properly.

When the ultrasonic wave is continued to be applied after completion of the bonding, such a case may arise where a foreign substance is produced due to abrasion between the terminal (main terminal 4, signal terminal 5) and the ultrasonic tool 21. However, adjusting the bonding condition properly according to the determination result of the bonded state, namely, stopping the application of the ultrasonic wave promptly when the bonded state is determined to be non-defective, makes it also possible to prevent the production of the foreign substance. Furthermore, this also leads to reducing the deterioration of the ultrasonic tool 21 caused by abrasion, to thereby make the ultrasonic tool 21 longer in duration of life. Heretofore, if even only one of the plural terminals in the power semiconductor device 1 is lack of bonded area, it is required to determine the device to be defective or to perform repairing after completion of inspection for all of the terminals. However, according to the ultrasonic bonding apparatus 50 of Embodiment 1, feeding back the determination result of the bonded state in the above manner in the ultrasonic bonding process, makes it possible to almost eliminate the defect due to lack of bonded area. The adjustment of the bonding condition using feedback to the ultrasonic bonding apparatus 50 is a particular advantage that is achievable only when the inspection is performed during ultrasonic bonding.

Figure 19:
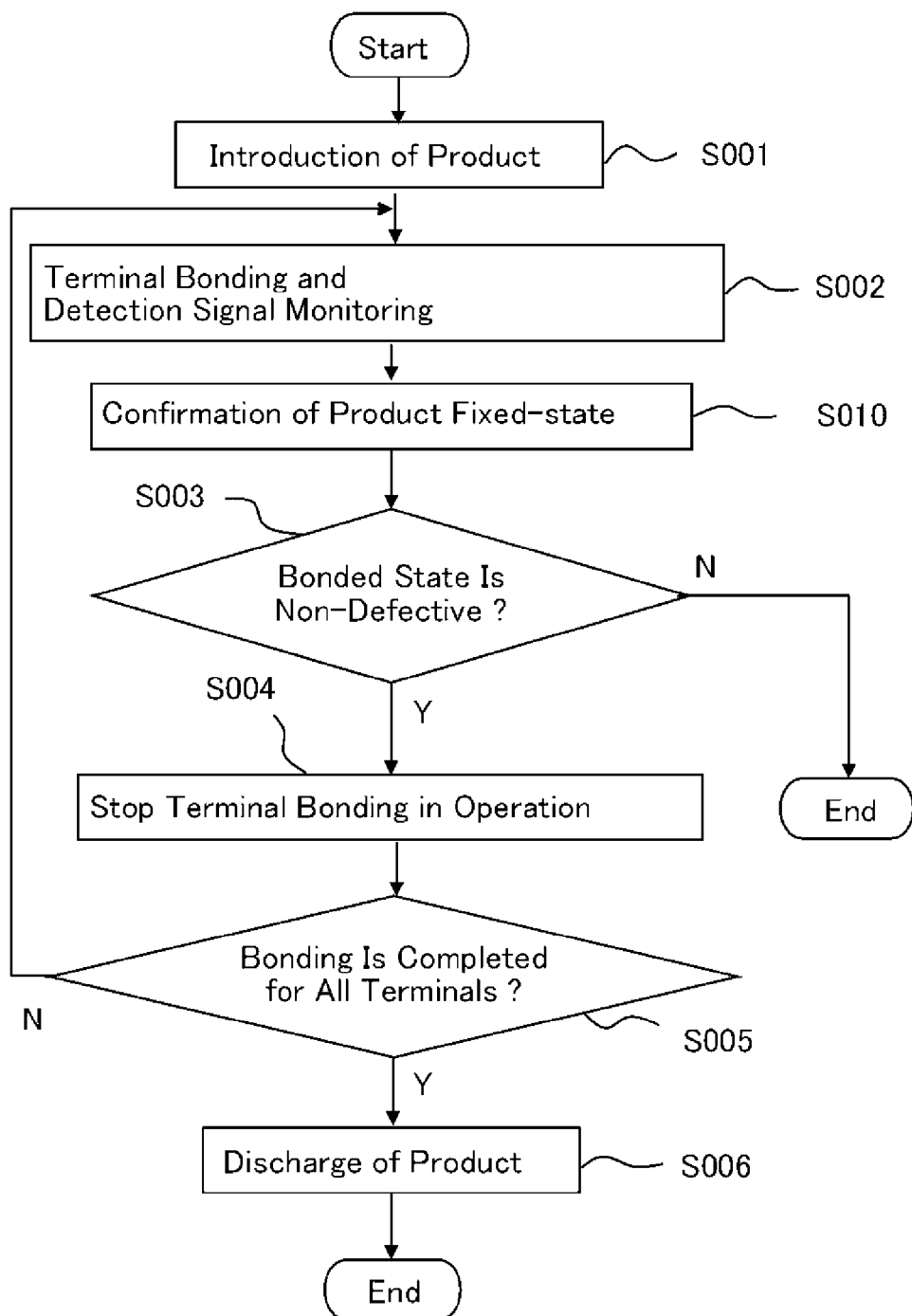
FIG. 19 is a flowchart showing a third example of the bonding process according to Embodiment 1 of the invention.

Since the power semiconductor device 1 is larger in size in comparison with a general semiconductor device, its warpage as a product is relatively large in comparison with the general semiconductor device. The force for fixing the product at the time of ultrasonic bonding is generally controlled to have a given constant value. However, for example, when the warpage of the product is large, such a case may arise in which the product is vibrated during the bonding, so that the energy for ultrasonic bonding is not properly applied to the ultrasonically bonded portion 17, 18. This vibration of the product can be detected using the AE signal. FIG. 19 is a flowchart showing a third example of the bonding process according to Embodiment 1 of the invention. The flowchart shown in FIG. 19 is an example resulting from adding Step S010 to the flowchart of FIG. 10 so that the vibration of the product is detected and its resultant is fed back to the ultrasonic bonding apparatus 50.

In Step S010, immediately after the initiation of the ultrasonic bonding, a vibration of the product is detected using the AE signal, so that the fixed state of the product is confirmed (product fixed-state confirming step). When, in Step S010, the fixed state of the product is non-defective, the flow moves to Step S003. When, in Step S010, the fixed state of the product is defective, the flow is interrupted tentatively and the force for fixing the product is increased. At the time of restart, processing is carried out from Step S002. As a method of increasing the force for fixing, when the product is to be fixed by screw fastening, a method of increasing a screw fastening torque is useful. Further, when it is to be fixed using the upper jigs 25, in order to increase clamping power of the upper jigs 25, a method of enhancing the pressure thereto is useful.

According to the ultrasonic bonding apparatus 50 of Embodiment 1 in which the bonding process shown by the flowchart of FIG. 19 is executed, it is possible, immediately after the initiation of the bonding, to increase the force for fixing the product upon confirmation of the fixed state of the product, to thereby perform the bonding normally. Note that Step S010 may be added in between Step S002 and Step S003 in the flowchart of FIG. 16. Even in this case, it is possible to increase the force for fixing the product immediately after the initiation of the bonding, to thereby perform the bonding normally.

Figure 20:
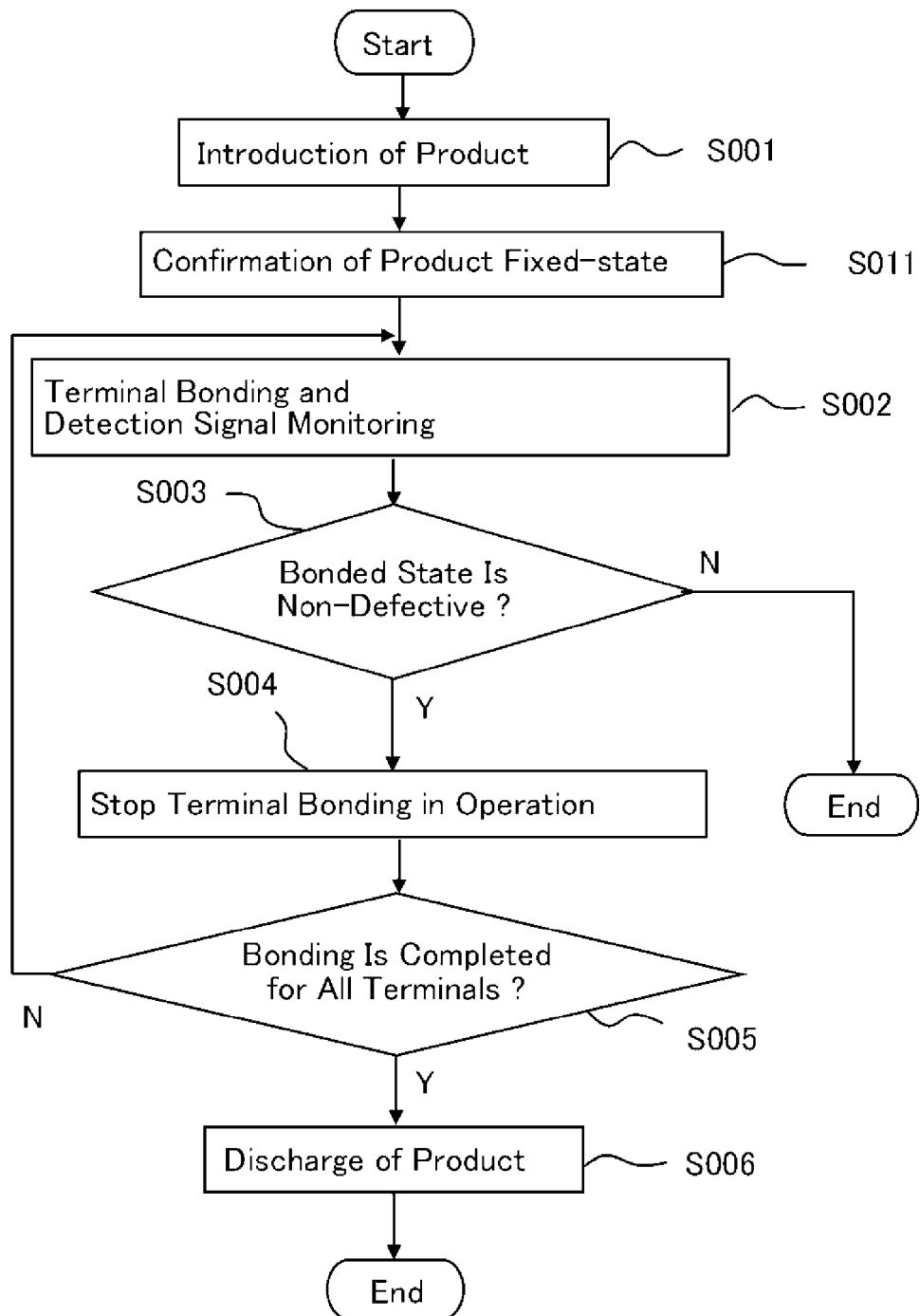
FIG. 20 is a flowchart showing a fourth example of the bonding process according to Embodiment 1 of the invention.

In order that the bonding quality may not be affected by individual differences between the products, a following method is also provided. The fixed state of the product may be detected before the bonding in such a manner that, before the ultrasonic bonding, the ultrasonic tool 21 is oscillated while being pushed against a region on the wiring pattern 10 that is functionally unnecessary for the product, and the AE signal at that time is detected. FIG. 20 is a flowchart showing a fourth example of the bonding process according to Embodiment 1 of the invention. The flowchart shown in FIG. 20 is an example resulting from adding Step S011 to the flowchart of FIG. 10 so that the vibration of the product is detected and its resultant is fed back to the ultrasonic bonding apparatus 50. In Step S011, operations similar to those in Step S010 in the flowchart of FIG. 19 are carried out.

In Step S011, before the ultrasonic bonding, the vibration of the product is detected using the AE signal, so that the fixed state of the product is confirmed (product fixed-state confirming step). When, in Step S011, the fixed state of the product is non-defective, the flow moves to Step S002. When, in Step S011, the fixed state of the product is defective, the flow is interrupted tentatively and the force for fixing the product is increased. At the time of restart, processing is carried out from Step S011. The method of increasing the force for fixing the product is the same as the method described with respect to the flowchart of FIG. 19. According to the ultrasonic bonding apparatus 50 of Embodiment 1 in which the bonding process shown by the flowchart of FIG. 20 is executed, it is possible to confirm the fixed state of the product before the bonding, to thereby adjust the force for fixing the product before the bonding. This makes it possible to achieve the products with uniform bonding quality.

Furthermore, when the above method of pushing the ultrasonic tool 21 to detect the vibration beforehand, is performed at multiple points on the wiring pattern 10 in a common product, the accuracy can be enhanced. In particular, when the method is performed near the four corners of the circuit board 8 each provided as a product fixing portion, it is possible to immediately determine which fixing portion(s) among four fixing portions in the case 2 (its portions where the attachment holes 7 are created) should be adjusted, and the accuracy can be further enhanced. By such a way, the fixed state of the product can be determined before the initiation of the ultrasonic bonding, so that the ultrasonic bonding can be performed with the force for fixing the product increased before the ultrasonic bonding. It is possible to decrease the rate of cases where the bonding is determined to be defective in the bonded-state determination step as Step S003. Further, when, in Step S011, the fixed state of the product is defective, it is allowed that the processing is once terminated and then, after the force for fixing the product is increased, the product of the same is introduced again into the bonding process (put into execution from START).

It is noted that Step S011 may be added in between Step S001 and Step S002 in the flowchart of FIG. 16.
Even in this case, it is possible to confirm the fixed state of the product before the bonding, to thereby adjust the force for fixing before the bonding. This makes it possible to achieve the products with uniform bonding quality.

Figure 21:
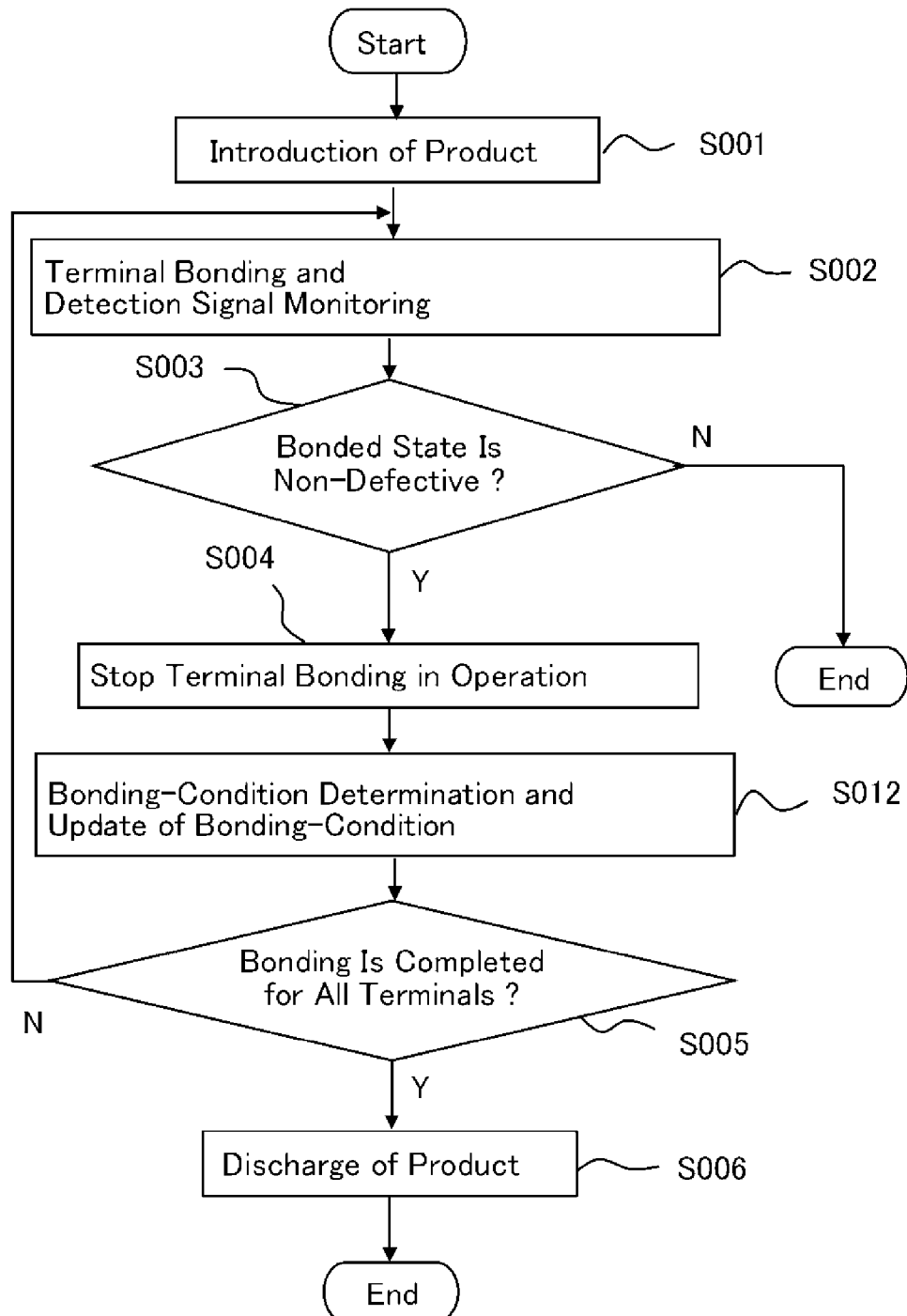
FIG. 21 is a flowchart showing a fifth example of the bonding process according to Embodiment 1 of the invention.

So far, the description has been made about the case of using the AE signal during application of the ultrasonic wave at the bonding in the ultrasonic bonding process. However, as described previously, in some instances, an ultrasonic wave is applied to the ultrasonic tool 21 at the time it is to be released (tool releasing time), in order to eliminate biting between the ultrasonic tool 21 and the terminal after completion of the bonding, so that a determination result using the AE signal due to application of the ultrasonic wave at the tool releasing time, may be fed back to the ultrasonic bonding apparatus 50. FIG. 21 is a flowchart showing a fifth example of the bonding process according to Embodiment 1 of the invention. The flowchart shown in FIG. 21 is an example resulting from adding Step S012 to the flowchart of FIG. 10 so that the bonded state is determined and its resultant is fed back to the ultrasonic bonding apparatus 50. Description will be made about portions other than those in the flowchart of FIG. 10.

In Step S004, the application of the ultrasonic wave and the pressing of the ultrasonic tool 21 for the terminal in operation are stopped. Thereafter, in Step S012, an ultrasonic wave is applied in order to eliminate biting between the ultrasonic tool 21 and the terminal after completion of the bonding. In the fifth example of the bonding process, the application of the ultrasonic wave in the releasing condition and the releasing of the ultrasonic tool that are employed in Step S004 in the first to fourth examples of the bonding process, are performed in Step S012. Then, during application of the ultrasonic wave in the releasing condition, the detection signal sig1 is monitored by the bonded-state measuring device 31 (post-stopping detection signal monitoring step). The bonded-state determination device 32 imports the detection signal sig1 using the signal input unit 36, and performs signal processing on the detection signal sig1, for example, performs extraction of the circumferential shape, using the signal processing unit 37, so that monitoring of the detection signal sig1 in the detection signal monitoring step is done.

Using a low voltage value indicative of non-defectiveness in bonding, the determination unit 39 determines whether or not, in the circumferential shape of the detection signal sig1, a shape which is like that shown in the broken-line frame 73 in FIG. 9 (low quality shape), or the like, emerges. When the low quality shape or the like emerges in the circumferential shape of the detection signal sig1, the bonding condition is determined to be improper, so that changing of the bonding condition (updating of bonding condition) is performed. When the low quality shape or the like does not emerge in the circumferential shape of the detection signal sig1, the bonding condition is determined to be proper, so that changing of the bonding condition (updating of bonding condition) is not performed, namely, the current bonding condition is maintained. Step S012 is a bonding-condition determination and bonding-condition updating step.

In the case where the inspection is performed according to this method, it is possible to predict from, for example, an AE signal of the previous terminal after being bonded ultrasonically, a bonding quality at the time ultrasonic bonding is performed in the same condition. This makes it possible, when degradation in the bonding quality of the next terminal is predicted from the AE signal of the previous terminal, to suppress the degradation in the bonding quality by changing the condition for the next terminal. For example, in the case where the previous terminal has been degraded in the bonded state after the bonding, feedback is performed for changing the bonding condition, such as, for making higher the bonding load (applied force) for the next terminal as shown in FIG. 22 or for increasing the ultrasonic-wave application time, so that the degradation in the bonding quality can be prevented and thus the bonding quality is maintained.

Figure 22:
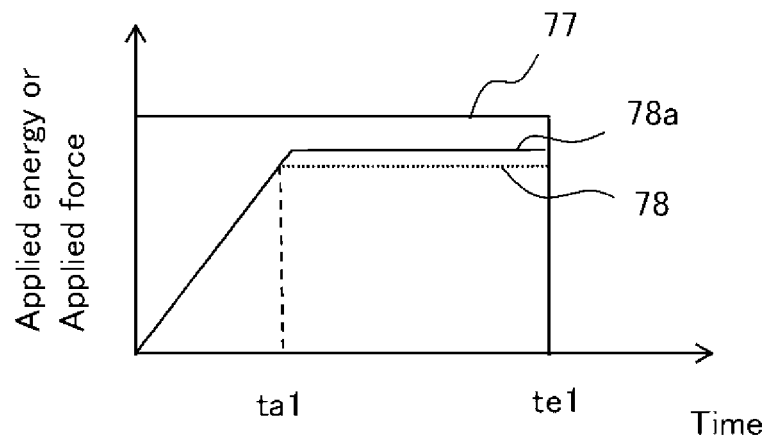
FIG. 22 is a diagram showing a fifth example of the ultrasonic-wave application condition according to the ultrasonic bonding apparatus of FIG. 1.

FIG. 22 is a diagram showing a fifth example of the ultrasonic-wave application condition according to the ultrasonic bonding apparatus of FIG. 1. In FIG. 22, the abscissa represents time, and the ordinate represents the application energy or the applied force. In FIG. 22, ultrasonic-wave application energy 77 and applied forces 78, 78a are drawn simultaneously. The magnitude of the applied force 78*a* (load) is higher than the magnitude of the applied force 78 (load). Note that such a bonding-condition determination may be performed using an arithmetically processed waveform obtained through numerical arithmetic processing, such as, FFT or the like. Further, Step S012 may be added in between Step S004 and Step S005 in the flowchart of FIG. 16. Even in this case, when degradation in the bonding quality of the next terminal is predicted from the AE signal of the previous terminal, it is possible to suppress the degradation in the bonding quality by changing the following condition.

Inspection of the bonded state, etc. may also be performed using multiple AE sensors 33. When the inspection is performed using the multiple AE sensors 33, a following effect will be exerted. In the case where the multiple AE sensors 33 have their respective detection frequency ranges with peaks different from each other, it is possible, without performing FFT analysis, to detect a frequency band of the generated signals by comparing the magnitudes of the signals detected by the individual AE sensors 33 relatively with each other. This makes it easier to differentiate the generation sources of the signals.

In the case where the multiple AE sensors 33 have their respective detection frequency ranges with peaks equal or equivalent to each other, it is possible to specify or narrow down to, a loosened fixing spot among product fixing spots existing plurally, by making confirmation on the signals detected by the respective AE sensors 33 while finely partitioning a period of generation time of these signals. Namely, since the transmission of the AE signal in the lower jig 24 takes time, it is possible to determine that a fixing portion near the AE sensor 33 that has detected the signal most quickly is loosened.

In the case of differentiating the generation sources according to the differences in the detection frequency ranges, the fixed positions of the multiple AE sensors 33 may be any positions if they are on the lower jig 24. In order to specify a fixing-loosened spot according to the generation time, it is desired to place the AE sensors 33 at equal intervals or in a regular manner. For example, when the four corners of the product are fixed by screws, it is possible to achieve such detection by placing the respective AE sensors 33 near the screws.

So far, the description has been made about the case of the ultrasonic bonding process for the copper terminal (main terminal 4, signal terminal 5); however, in a wire bonding process that is a process in which an ultrasonic wave is applied similarly, namely, in an ultrasonic bonding process using the connecting wire 15 as a bonding member, an effect similar to the above will also be exerted. Further, with a structure that is different to that of the power semiconductor device 1 shown in this embodiment, if it is a structure to be bonded ultrasonically, an effect similar to the above will also be exerted. In this embodiment, the description has been made about the case of ultrasonic bonding between metals; however, in the case where a material other than metal is bonded or adhesively joined, an effect similar to the above will also be exerted.

As described above, the ultrasonic bonding apparatus 50 of Embodiment 1 is an ultrasonic bonding apparatus for bonding a bonding target member (wiring pattern 10) and a bonding member (main terminal 4, signal terminal 5) together using an ultrasonic wave, which is characterized by comprising: the ultrasonic bonding machine 20 having the ultrasonic tool 21 for applying the ultrasonic wave to the bonding target member (wiring pattern 10) mounted on a fixed object (power semiconductor device 1) fixed to a jig (lower jig 24), while pressing the bonding member (main terminal 4, signal terminal 5) against the bonding target member; and the bonding inspection apparatus 30 for inspecting a bonding quality of the bonding target member (wiring pattern 10) and the bonding member (main terminal 4, signal terminal 5). The bonding inspection apparatus 30 of the ultrasonic bonding apparatus 50 is characterized by comprising: the bonded-state measuring device 31 that is fixed to the jig (lower jig 24) and provided for detecting a sound propagating in the jig (lower jig 24) to thereby output the detection signal sig1; and the bonded-state determination device 32 for determining, in a bonding process for the bonding target member (wiring pattern 10) and the bonding member (main terminal 4, signal terminal 5), a bonded state between the bonding target member (wiring pattern 10) and the bonding member (main terminal 4, signal terminal 5), on the basis of the detection signal sig 1 outputted by the bonded-state measuring device 31. According to the ultrasonic bonding apparatus 50 of Embodiment 1, because of these characteristics, the bonded state between the bonding target member (wiring pattern 10) and the bonding member (main terminal 4, signal terminal 5) is determined based on the detection signal sig 1 outputted by the bonded-state measuring device 31 in the bonding process. Thus, it is possible to inspect the bonding quality in real-time in the bonding process, and to reduce time taken for the quality inspection, and further to accurately determine whether the quality is defective or not.

The ultrasonic bonding inspection method of Embodiment 1 is an ultrasonic bonding inspection method for inspecting a bonding quality of the bonded portion obtained by bonding between a bonding target member (wiring pattern 10) mounted on a fixed object (power semiconductor device 1) fixed to a jig (lower jig 24), and a bonding member (main terminal 4, signal terminal 5) using an ultrasonic wave. The ultrasonic bonding inspection method of Embodiment 1 is characterized by including: a detection signal monitoring step of detecting, in the bonding process for the bonding target member (wiring pattern 10) and the bonding member (main terminal 4, signal terminal 5), a sound propagating in the jig (lower jig 24), to thereby output a detection signal sig1; and a bonded-state determination step of determining a bonded state between the bonding target member (wiring pattern 10) and the bonding member (main terminal 4, signal terminal 5) on the basis of the detection signal sig1 outputted in the detection signal monitoring step. According to the ultrasonic bonding inspection method of Embodiment 1, because of these characteristics, the bonded state between the bonding target member (wiring pattern 10) and the bonding member (main terminal 4, signal terminal 5) is determined based on the detection signal sig 1 outputted in the detection signal monitoring step executed in the bonding process. Thus, it is possible to inspect the bonding quality in real-time in the bonding process, and to reduce time taken for the quality inspection, and further to accurately determine whether the quality is defective or not.

In another aspect, the ultrasonic bonding apparatus 50 of Embodiment 1 is an ultrasonic bonding apparatus for bonding a bonding target member (wiring pattern 10) and a bonding member (main terminal 4, signal terminal 5) together using an ultrasonic wave, which is characterized by comprising: the ultrasonic bonding machine 20 having the ultrasonic tool 21 for applying the ultrasonic wave to the bonding target member (wiring pattern 10) mounted on a fixed object (power semiconductor device 1) fixed to a jig (lower jig 24), while pressing the bonding member (main terminal 4, signal terminal 5) against the bonding target member; and the bonding inspection apparatus 30 for inspecting a bonding quality of the bonding target member (wiring pattern 10) and the bonding member (main terminal 4, signal terminal 5). The bonding inspection apparatus 30 of the ultrasonic bonding apparatus 50 is characterized by comprising: the bonded-state measuring device 31 for detecting a vibration propagating in the jig (lower jig 24) or the housing 28 of the ultrasonic bonding machine 20 equipped with the jig (lower jig 24), using a sensor (AE sensor 33) that is fixed to the jig (lower jig 24) or the housing 28 at a position at which it does not make contact with the bonding target member (wiring pattern 10) and the bonding member (main terminal 4, signal terminal 5) and that detects the vibration, to thereby output a detection signal sig1; and the bonded-state determination device 32 for determining, in a bonding process for the bonding target member (wiring pattern 10) and the bonding member (main terminal 4, signal terminal 5), a bonded state between the bonding target member (wiring pattern 10) and the bonding member (main terminal 4, signal terminal 5), on the basis of the detection signal sig1 outputted by the bonded-state measuring device 31. According to the ultrasonic bonding apparatus 50 of Embodiment 1, because of these characteristics, the bonded state between the bonding target member (wiring pattern 10) and the bonding member (main terminal 4, signal terminal 5) is determined based on the detection signal sig 1 outputted by the bonded-state measuring device 31 in the bonding process. Thus, it is possible to inspect the bonding quality in real-time in the bonding process, and to reduce time taken for the quality inspection, and further to accurately determine whether the quality is defective or not.

In another aspect, the ultrasonic bonding inspection method of Embodiment 1 is an ultrasonic bonding inspection method for inspecting a bonding quality of the bonded portion obtained by bonding between a bonding target member (wiring pattern 10) mounted on a fixed object (power semiconductor device 1) fixed to a jig (lower jig 24), and a bonding member (main terminal 4, signal terminal 5) using an ultrasonic wave. The ultrasonic bonding inspection method of Embodiment 1 is characterized by including: a detection signal monitoring step of detecting, in the bonding process for the bonding target member (wiring pattern 10) and the bonding member (main terminal 4, signal terminal 5), a vibration propagating in the jig (lower jig 24) or the housing 28 of the ultrasonic bonding machine 20 equipped with the jig (lower jig 24), to thereby output a detection signal sig1; and a bonded-state determination step of determining a bonded state between the bonding target member (wiring pattern 10) and the bonding member (main terminal 4, signal terminal 5) on the basis of the detection signal sig1 outputted in the detection signal monitoring step. According to the ultrasonic bonding inspection method of Embodiment 1, because of these characteristics, the bonded state between the bonding target member (wiring pattern 10) and the bonding member (main terminal 4, signal terminal 5) is determined based on the detection signal sig1 outputted in the detection signal monitoring step executed in the bonding process. Thus, it is possible to inspect the bonding quality in real-time in the bonding process, and to reduce time taken for the quality inspection, and further to accurately determine whether the quality is defective or not.

When, as in Patent Document 3, the vibration sensor such as an AE sensor, etc. is caused to abut on the bonding target member or the bonding member included in the product, or a vibration transmission member that intermediates between the target member or the bonding member and the ultrasonic tool 21 serving to press the bonding target member or the bonding member, is provided and the vibration sensor is attached to that vibration transmission member, the sensor will be removed easily because of the product vibrating due to the application energy at the time of the ultrasonic bonding; thus, it is difficult to do so. When the vibration sensor is mechanically attached using a screw or the like, the bonding target member or the bonding member may make partial contact with the sensor to develop a space therebetween, resulting in decreased detection accuracy. When it is attached adhesively or likewise, there is a problem that a material used at the time of attachment causes residue inside the product. Further, in the case where a portion to be bonded is placed inside a power module, it is difficult to attach the vibration sensor thereto because an insert case covering the outside of the power module stands as an obstacle. When the method of attaching the AE sensor 33 according to this embodiment is used, it becomes unnecessary to attach the sensor to the product including the bonding target member and the bonding member, as a whole. Further, it is difficult to provide the vibration transmission member that intermediates between the target member or the bonding member and the ultrasonic tool 21 serving to press the bonding target member or the bonding member, and to attach the vibration sensor to that vibration transmission member, as in Patent Document 3.

The reason is that the sensor will be removed easily because of the vibration transmission member strongly vibrating due to the application energy at the time of the ultrasonic bonding.

Figure 24:
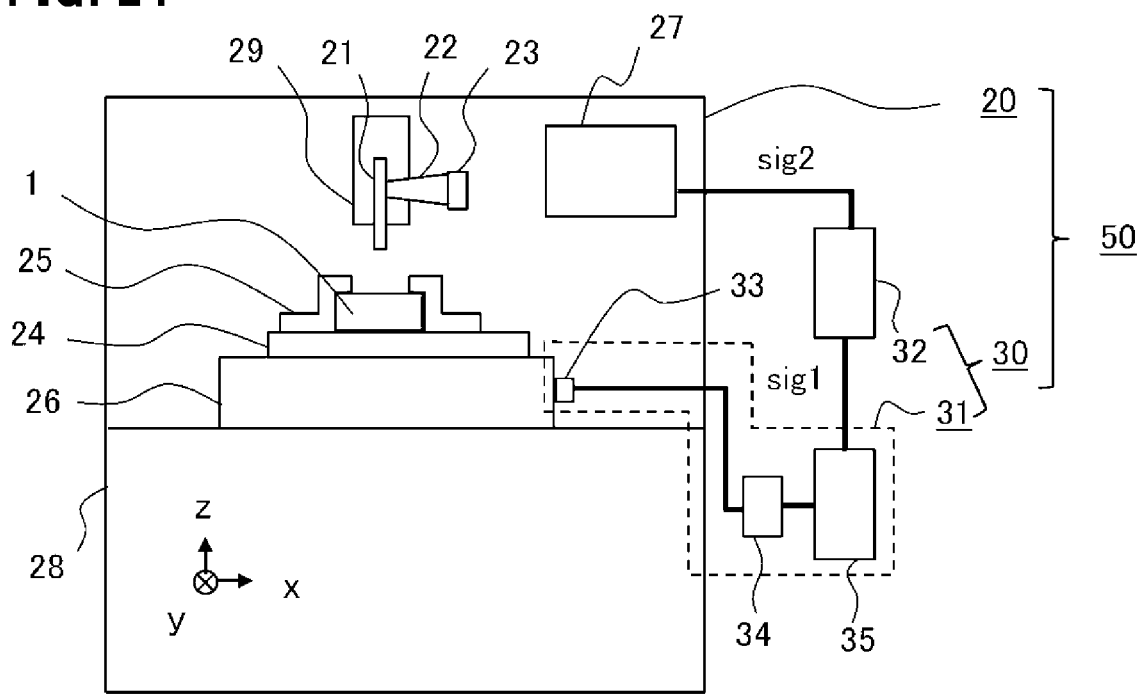
FIG. 24 is a diagram showing another ultrasonic bonding apparatus according to Embodiment 1 of the invention.
Figure 25:
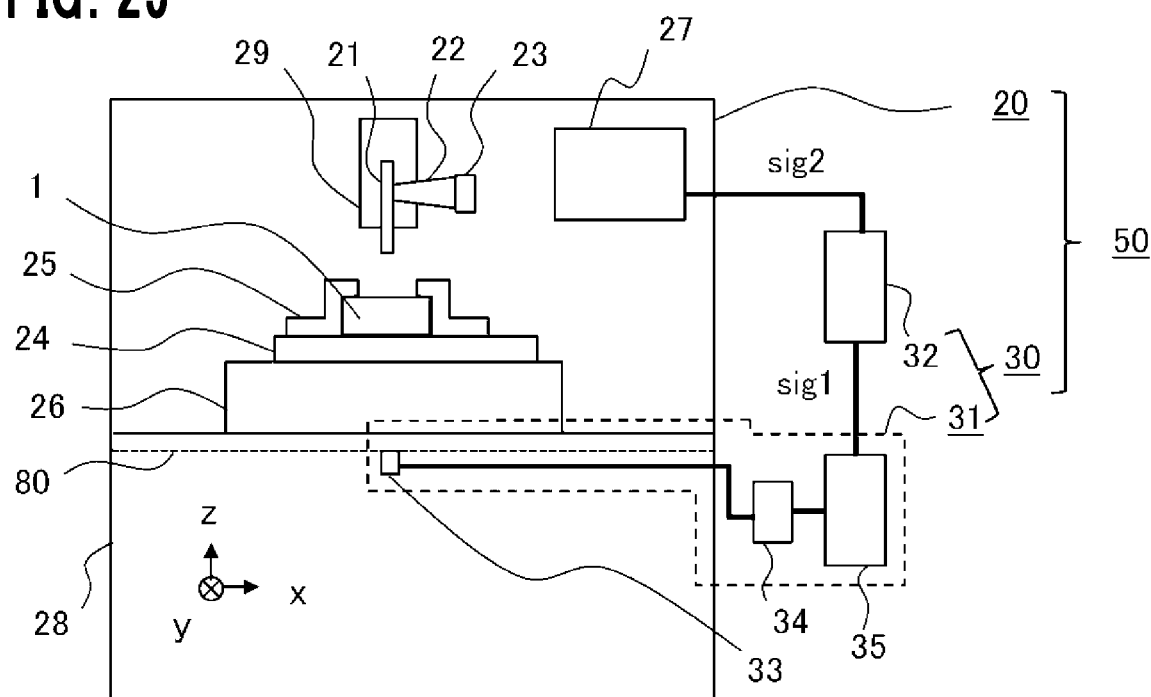
FIG. 25 is a diagram showing still another ultrasonic bonding apparatus according to Embodiment 1 of the invention.

An attached position of the AE sensor 33 only has to have a continuous relation to the jig to which an object to be bonded is fixed. For example, when, like in FIG. 24, the AE sensor 33 is placed on a housing of the facility, namely, the housing 28 of the ultrasonic bonding machine 20, an adequate AE signal can also be detected. Further, when, like in FIG. 25, the AE sensor 33 is placed on the top side or the back side of the movable stage 26 of the ultrasonic bonding machine 20, an adequate AE signal can also be detected. FIG. 24 is a diagram showing another ultrasonic bonding apparatus according to Embodiment 1 of the invention, and FIG. 25 is a diagram showing still another ultrasonic bonding apparatus according to Embodiment 1 of the invention. In FIG. 25, an example is shown in which the AE sensor 33 is attached to a back surface of a top board 80 of the housing 28, namely, to its surface on the side opposite to its surface on which the power semiconductor device 1 is placed. In FIG. 24, an example is shown in which the AE sensor 33 is attached to a side surface of the movable stage 26. The reason why the attached position of the AE sensor 33 only has to have a continuous relation to the jig, is that acoustic emission is nearly not attenuated inside a material in a continuous relation to the jig. In particular, when the material in a continuous relation to the jig is metal, attenuation of acoustic emission is extremely small, so that the material of the housing, etc. of the facility is desired to be metal. When the AE sensor 33 is attached to the top surface or the side surface of the movable stage 26, it is desired that a metal material be used as the material of the movable stage 26. When, as shown in FIG. 25, the top board 80 as a part of the housing 28 intermediates between the AE sensor 33 and the movable stage 26, it is desired that a metal material be used as the material of the top board 80. However, when the ultrasonic horn for generating the ultrasonic wave is attached to the housing of the facility, acoustic emission from that housing may possibly be detected. Even in this case, when the distance to the AE sensor 33 from a position in the housing at which the jig is fixed, is set less than the distance to the AE sensor 33 from a position in the housing at which the ultrasonic horn is attached, acoustic emission from the jig can be detected accurately.

Further, when the AE sensor 33 is attached to a surface of the upper jig 25, an adequate AE signal can also be detected. The upper jigs are generally provided at two places on both sides of the product, or at four places on both upper and lower lateral sides or four corners thereof. When the multiple AE sensors 33 are attached to the respective jigs and then, the time taken for the AE signal to reach each of the sensors from the initiation of application of ultrasonic vibration, or the amplitude thereof, is monitored, it is possible to specify the position of the jig by which fixing is insufficient. Namely, when fixing is insufficient, a fixed area between the product and the jig becomes smaller, so that it takes time until arrival of the signal and the amplitude is attenuated. Thus, based on these facts, it is possible to immediately specify the position of the upper jig by which fixing is insufficient, while determining whether defective or not.

Further, when the AE sensor 33 is attached near the ground on which the facility is placed, it picks up a noise from another facility, etc., in some cases. In these cases, when a rubber or the like is attached on the installation surface (bottom surface) of the facility, it becomes possible to attenuate the signal from the other facility, etc. Further, at the time of determination on the detection signal sig1, with the provision of a bandpass filter, it is possible to eliminate an external frequency that causes a noise. Note that, when energy of the vibration at the time of ultrasonic bonding is large, it is not allowed to attach the AE sensor 33 to the ultrasonic tool 21 because the AE sensor 33 will be removed or broken.

In the case of bonding the bonding target member (wiring pattern 10) and the bonding member (main terminal 4, signal terminal 5) together, in order to achieve an adequate bonding strength, it is required to apply ultrasonic energy around the bonding interface between the bonding target member (wiring pattern 10) and the bonding member (main terminal 4, signal terminal 5). When the product (power semiconductor device 1) is insufficiently fixed by the jig (upper jig 24, lower jig 25) or the ultrasonic tool 21 is attached loosely, no adequate bonding strength is achieved. Insufficient fixing by the jig is assumed to be due to warpage of the product, warpage or deterioration of the jig, deterioration or insufficient torque of the screw for fixing, or the like. It is assumed to be due to partial contact of the contacting surface, deterioration of the contacting surface, or the like, when the upper jig 25 is used for fixing the product (power semiconductor device 1). The AE signal is characterized in that the frequencies of AE signals generated due to these respective factors are different from each other. When the AE signal at the time of ultrasonic bonding is detected using the AE sensor 33 and the frequency of the AE signal is monitored on a time axis, it is possible to immediately identify the factor for reducing the strength. When it is difficult to make identification because a frequency difference is slight, it is possible, by placing the AE sensors at plural positions on the lower jig 24, to identify the factor according to phase differences or amplitude levels of the AE signals individually detected by them.

Further, it is possible to determine whether the bonding is defective or not, according to a difference in phase (phase difference) between the waveform of the applied ultrasonic wave and the waveform of the AE signal. Namely, if the phase difference is small, this means that the application energy at the time of ultrasonic bonding is properly applied toward the bonding interface and the AE signal at that instance is properly transmitted from the jig to the AE sensor 33. In contrast, if the phase difference is large, this is because a pathway through which the AE signal is transmitted has been extended due to a gap placed beneath the bonded portion and between the product and the jig, or the like, to thereby increase the time taken to reach the AE sensor 33. Accordingly, if the phase difference is large, this means that the energy of the ultrasonic wave is not properly applied toward the bonding interface.

Embodiment 2

Figure 23:
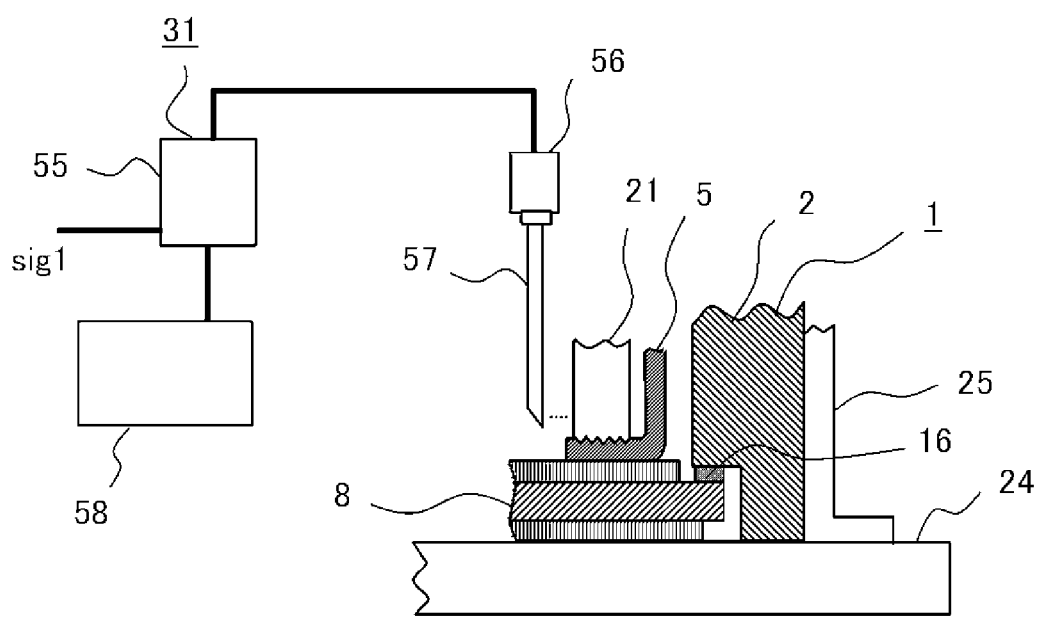
FIG. 23 is a diagram showing a bonded-state measuring device according to Embodiment 2 of the invention.

An ultrasonic bonding apparatus 50 of Embodiment 2 according to the invention will be described. In the ultrasonic bonding apparatus 50 of Embodiment 2, its bonded-state measuring device 31 differs from that in Embodiment 1. FIG. 23 is a diagram showing the bonded-state measuring device according to Embodiment 2 of the invention. Other than the bonded-state measuring device 31, the ultrasonic bonding apparatus 50 of Embodiment 2 is the same as the above, so that description will be made about the bonded-state measuring device 31.

What differs from Embodiment 1 is that, using a laser Doppler vibrometer 56 as a non-contact vibrometer, a laser is radiated to the ultrasonic tool 21 provided as a measuring target (subject to monitoring) to thereby measure a vibration. The bonded-state measuring device 31 in Embodiment 2 comprises: the laser Doppler vibrometer 56; a laser reflective mirror 57; a measuring device 55 for measuring a signal detected by the laser Doppler vibrometer 56 (signal containing information about the vibration of the measuring target); and a data logger 58 for recording data measured by the measuring device 55.

The laser Doppler vibrometer 56 detects a velocity and a displacement of the vibration at a point irradiated by the laser. The measuring device 55 outputs the signal detected by the laser Doppler vibrometer (signal containing information about the vibration of the measuring target) as a detection signal sig1, to the bonded-state determination device 32.

When, using the laser Doppler vibrometer 56, the laser is radiated to the ultrasonic tool 21 to thereby measure the vibration, it is possible to determine whether the bonding quality of the bonding member (main terminal 4, signal terminal 5) and the bonding target member (wiring pattern 10) is defective or not. Specifically, it is possible to determine whether the bonding quality is defective or not, according to a difference between: a vibration displacement amount corresponding to a necessary bonded area (reference displacement amount) with respect to the bonded area between the bonding member (main terminal 4, signal terminal 5) and the bonding target member (wiring pattern 10); and a measured vibration displacement amount (measured displacement amount). When the difference between the reference displacement amount and the measured displacement amount is within a threshold value, the bonded state is determined to be non-defective. When the difference between the reference displacement amount and the measured displacement amount exceeds the threshold value, the bonded state is determined to be defective (bad). Because the displacement amount is measured in this manner, the ultrasonic bonding apparatus 50 of Embodiment 2 is characterized by being capable of recognizing a vibration state more quantitatively than the ultrasonic bonding apparatus 50 of Embodiment 1. According to the ultrasonic bonding apparatus 50 of Embodiment 2, like in the ultrasonic bonding apparatus 50 of Embodiment 1, it is unnecessary to attach a detector (the laser Doppler vibrometer 56) of the bonded-state measuring device 31 to the product because the bonded state of the product is inspected in a contactless manner. Thus, it is possible to make the inspection time shorter than that in the case where the inspection is performed in a manner that a tester is made in contact with the product.

When the terminal (main terminal 4, signal terminal 5) to be ultrasonically bonded is monitored together with the ultrasonic tool 21, a following effect will be achieved. For example, when the terminal (main terminal 4, signal terminal 5) is monitored after the monitoring of the ultrasonic tool 21, if the ultrasonic tool 21 and the terminal are in the same vibration state, it may be confirmed that the ultrasonic tool 21 could have properly applied an ultrasonic vibration to the terminal. If the terminal is smaller in vibration than the ultrasonic tool 21, it may be confirmed that abrasion occurred between the head of the ultrasonic tool 21 and the terminal and thus the tool could not have properly applied an ultrasonic vibration to the terminal. Due to that abrasion, copper swarf may be produced in some cases, so that it is possible to determine whether a removal process of the copper swarf is necessary or not, according to the vibration monitoring result. Further, when the terminal becomes smaller in vibration than the ultrasonic tool 21 because of the influence of individual differences between the products, for example, differences in warpage of the terminal or the like, this monitoring result is fed back, whereby the bonding condition is changed during ultrasonic bonding so that their vibration states become the same, for example, in a manner that the applied load is increased, or the like. This makes it possible to achieve a proper bonding quality while reducing the production of copper swarf to the minimum. Further, when the vibration of the circuit board 8 is also monitored and the vibrations of the terminal and the circuit board 8 are monitored concurrently with the vibration of the ultrasonic tool 21, an effect similar to the above can also be exerted.

With respect to the product, even when a measurement position at which a vibration is measured through laser radiation, is not on the ultrasonic tool 21, but on the bonding target member (wiring pattern 10), the bonding member (main terminal 4, signal terminal 5) or the jig (lower jig 24, upper jig 25) for fixing the product (power semiconductor device 1), an effect similar to the above will be exerted. When the AE signal shown in Embodiment 1 is used in combination, a new effect shown below will be exerted. When the inspection is performed using both of the AE signal by the AE sensor 33 described in Embodiment 1 and a vibration signal by the laser Doppler vibrometer described in Embodiment 2, it is possible to determine whether the bonding quality is defective or not, more highly accurately. Namely, whether or not the vibration of the ultrasonic tool 21 has been properly transmitted to the ultrasonically bonded portion 17, 18 can be inspected using the laser Doppler vibrometer, and further, whether or not friction at the interface between the bonding target member and the bonding member is normal, and whether or not the fixing of the product is normal, can be inspected using the AE signal detected by the AE sensor 33. This provides an advantage that the accuracy of the determination as to whether the bonding quality is defective or not, becomes much higher.

As described above, the ultrasonic bonding apparatus 50 of Embodiment 2 is an ultrasonic bonding apparatus for bonding a bonding target member (wiring pattern 10) and a bonding member (main terminal 4, signal terminal 5) together using an ultrasonic wave, which is characterized by comprising: the ultrasonic bonding machine 20 having the ultrasonic tool 21 for applying the ultrasonic wave to the bonding target member (wiring pattern 10) mounted on a fixed object (power semiconductor device 1) fixed to a jig (lower jig 24), while pressing the bonding member (main terminal 4, signal terminal 5) against the bonding target member; and the bonding inspection apparatus 30 for inspecting a bonding quality of the bonding target member (wiring pattern 10) and the bonding member (main terminal 4, signal terminal 5). The bonding inspection apparatus 30 of the ultrasonic bonding apparatus 50 is characterized by comprising: the bonded-state measuring device 31 for detecting a vibration of a measuring object vibrated by the ultrasonic wave, to thereby output the detection signal sig1; and the bonded-state determination device 32 for determining, in a bonding process for the bonding target member (wiring pattern 10) and the bonding member (main terminal 4, signal terminal 5), a bonded state between the bonding target member (wiring pattern 10) and the bonding member (main terminal 4, signal terminal 5), on the basis of the detection signal sig1 outputted by the bonded-state measuring device 31. According to the ultrasonic bonding apparatus 50 of Embodiment 2, because of these characteristics, the bonded state between the bonding target member (wiring pattern 10) and the bonding member (main terminal 4, signal terminal 5) is determined based on the detection signal sig1 outputted by the bonded-state measuring device 31 in the bonding process. Thus, it is possible to inspect the bonding quality in real-time in the bonding process, and to reduce time taken for the quality inspection, and further to accurately determine whether the quality is defective or not.

The ultrasonic bonding inspection method of Embodiment 2 is an ultrasonic bonding inspection method for inspecting a bonding quality of the bonded portion obtained by bonding between a bonding target member (wiring pattern 10) mounted on a fixed object (power semiconductor device 1) fixed to a jig (lower jig 24), and a bonding member (main terminal 4, signal terminal 5) using an ultrasonic wave. The ultrasonic bonding inspection method of Embodiment 2 is characterized by including: a detection signal monitoring step of detecting, in the bonding process for the bonding target member (wiring pattern 10) and the bonding member (main terminal 4, signal terminal 5), a vibration of a measuring object vibrated by the ultrasonic wave, to thereby output a detection signal sig1; and a bonded-state determination step of determining a bonded state between the bonding target member (wiring pattern 10) and the bonding member (main terminal 4, signal terminal 5) on the basis of the detection signal sig1 outputted in the detection signal monitoring step. According to the ultrasonic bonding inspection method of Embodiment 2, because of these characteristics, the bonded state between the bonding target member (wiring pattern 10) and the bonding member (main terminal 4, signal terminal 5) is determined based on the detection signal sig1 outputted in the detection signal monitoring step executed in the bonding process. Thus, it is possible to inspect the bonding quality in real-time in the bonding process, and to reduce time taken for the quality inspection, and further to accurately determine whether the quality is defective or not.

Embodiment 3

In Embodiment 3, description will be made about the cases where the ultrasonic bonding apparatus and the ultrasonic bonding inspection method in Embodiment 1 or Embodiment 2 are applied respectively to a wire bonding apparatus for bonding a connecting wire 15 in the product (power semiconductor device 1) and a wire bonding inspection method for inspecting a wire bonding portion after bonding that is an ultrasonically-bonded portion. The wire bonding apparatus is an apparatus for bonding a wire (corresponding to the bonding member) to an object to be bonded (corresponding to the bonding target member), by pressure bonding using ultrasonic vibration. The wire is made of Al with a diameter of 100 to 500 μm, or Au or Ag with a diameter of 10 to 50 μm. The summary of its configuration, the analysis on its detection signal sig1, and the feedback method to the apparatus on the basis of the detection signal sig1, are almost the same as in the ultrasonic bonding apparatus 50 shown in Embodiment 1. A frequency of 40 to 120 kHz is used that is higher than that by the ultrasonic bonding machine 20 in the ultrasonic bonding apparatus 50 of Embodiment 1 or Embodiment 2. The amplitude is about 1 to 5 μm that is smaller than that by the ultrasonic bonding machine 20 in Embodiment 1 or Embodiment 2. Namely, the frequency and the amplitude used in the wire bonding apparatus are high and small, respectively. In order to detect the vibration of the bonded portion between the bonding target member and the bonding member (connecting wire 15) that is caused by such a high-frequency and small-amplitude ultrasonic wave, the AE signal is well-suited. For example, the wire bonding apparatus as the ultrasonic bonding apparatus 50 of Embodiment 3 ultrasonically bonds the connecting wires 15a, 15b and 15c shown in FIG. 5 to the bonding target members (wiring patterns 10a, 10b and 10d, electrode of the IGBT 12, and electrode of the FwDi 13).

The reason why, in the wire bonding process using the wire bonding apparatus, namely, the ultrasonic bonding process using the ultrasonic bonding apparatus 50 of Embodiment 3, the AE signal is well-suited to the inspection of wire bonding and confirmation of the state of the wire bonding apparatus, will be described. The reason is that the width of the ultrasonic tool used in wire bonding is smaller than the width (5 to 10 mm) of the ultrasonic tool used in ultrasonic bonding of the main terminal 4 or the signal terminal 5. The ultrasonic tool for wire bonding the 100 to 500 μm Al wire has a width of 1 to 2 mm. Further, the ultrasonic tool for wire bonding the 10 to 50 μm Au/Ag wire has a width of 1 mm or less. Accordingly, the diameter of the wire is small while the cross-section of the wire has a circular shape, so that, with the wire bonding apparatus whose ultrasonic tool is small in width, it is difficult when the laser Doppler vibrometer is used, to radiate the laser to a target spot. Further, if the laser could be radiated thereto, it is difficult to cause the laser to be reflected perpendicularly, making it hard to detect the reflected laser. Furthermore, while a variety of materials, such as metal, ceramic and the like may be employed for the ultrasonic tool, such a material is chosen as the material of the ultrasonic tool that is adequate in view of bondability between the object to be bonded and the wire, so that, in many cases, it can not reflect the laser originally. Because of these reasons, it is required to detect the vibration of the ultrasonically-bonded portion between the object to be bonded and the wire in the wire bonding process, by a method other than that using the laser Doppler vibrometer. In such a case, it is well-suited to detecting the AE signal, for example, by attaching the AE sensor 33 on the jig, namely, on the outer surface of the jig.

Figure 26:
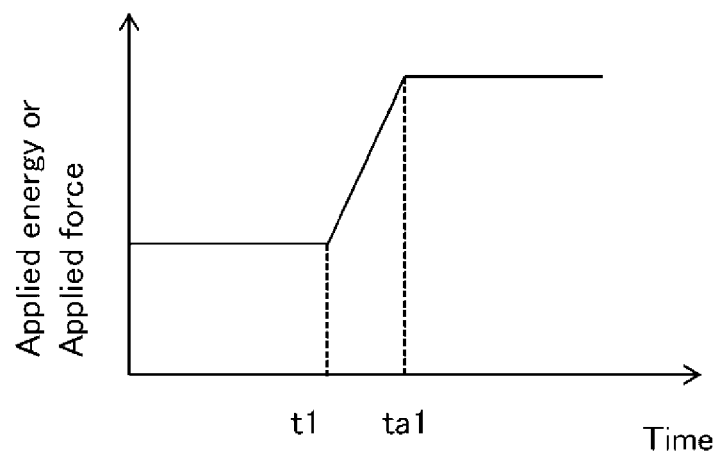
FIG. 26 is a diagram showing a wire bonding condition employed in a wire bonding apparatus according to Embodiment 3 of the invention.

A wire bonding condition employed in the wire bonding apparatus as the ultrasonic bonding apparatus 50 of Embodiment 3 is shown in FIG. 26. FIG. 26 is a diagram showing the wire bonding condition employed in the wire bonding apparatus according to Embodiment 3 of the invention. The main condition is represented by a load (magnitude of the applied force), power (applied energy) and time. In general, the load and the power are varied in two stages, and in an initial stage of bonding, an initially-bonded portion (portion serving as a nucleus) is formed using low load and power, and in a later stage of bonding, the load and the power are increased to thereby increase the bonded area. In FIG. 26, an example of the wire bonding condition is shown in which a weak load and low power are applied until Time t1 and thereafter, the load and the power are gradually increased until Time ta1. On this occasion, the frequency of the ultrasonic wave applied in the facility, namely, the ultrasonic bonding machine 20, is monitored and feedback-controlled, so that the frequency of the applied ultrasonic wave in the later stage is higher by several kHz than that in the initial stage. The wire bonding process includes an application-frequency changing step of increasing the application frequency of the ultrasonic wave to be applied by the ultrasonic tool 21 of the ultrasonic bonding machine 20 to the bonding target member (wiring patterns 10a, 10b and 10d, electrode of the IGBT 12, and electrode of the FwDi 13) and the bonding member (connecting wires 15a, 15b and 15c).

When a foreign substance (examples include an invisible substance such as oil, etc.) is present on the wiring pattern 10, the bonded area of the ultrasonically bonded portion will finally be reduced. Accordingly, the progress of the bonding is slow, and in that case, the timing at which the frequency of the ultrasonic wave to be applied in the later stage of bonding varies will be later than a normal one. When the timing at which the frequency varies is detected using the AE sensor 33, it becomes possible to easily determine whether the bonding of the ultrasonically bonded portion is defective or not.

Figure 27:
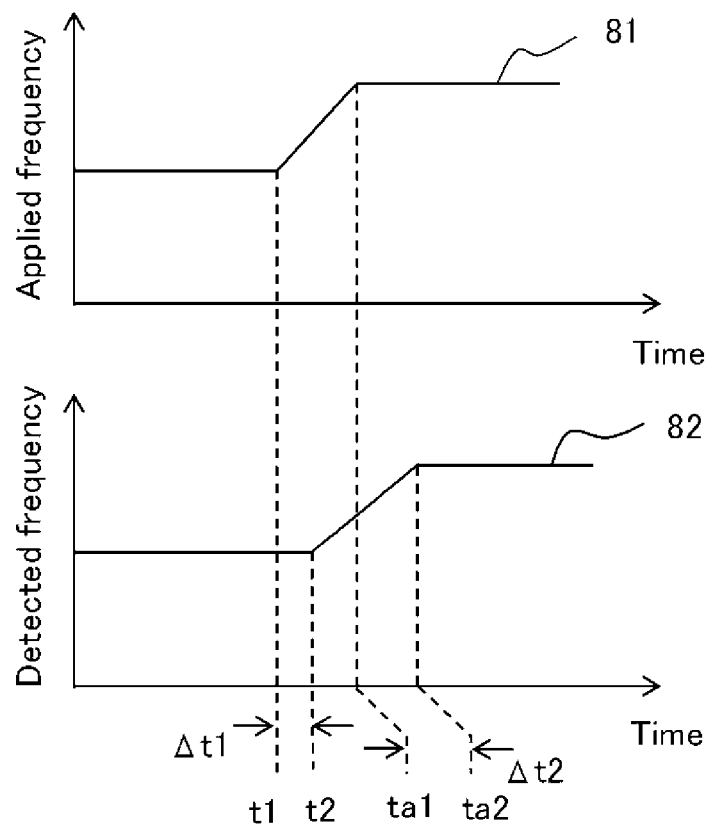
FIG. 27 is a diagram for illustrating how to determine whether bonding is defective or not, in an ultrasonic bonding inspection method according to Embodiment 3 of the invention.
Figure 28:
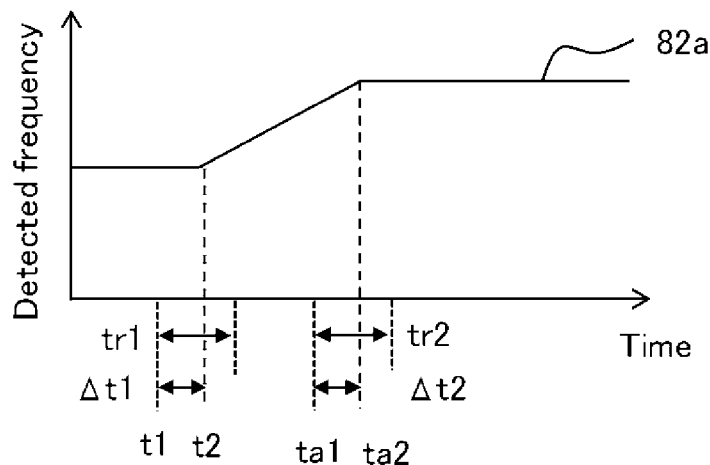
FIG. 28 is a diagram for illustrating a case where bonding is determined to be non-defective by the ultrasonic bonding inspection method according to Embodiment 3 of the invention.
Figure 29:
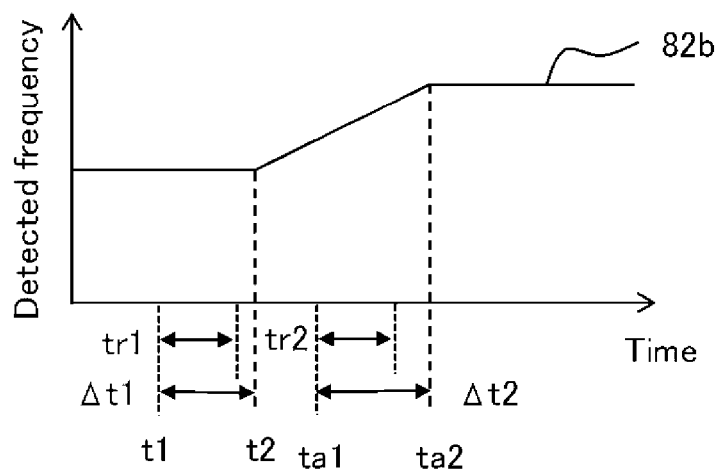
FIG. 29 is a diagram for illustrating a case where bonding is determined to be defective by the ultrasonic bonding inspection method according to Embodiment 3 of the invention.

Using FIG. 27 to FIG. 29, how to determine whether bonding is defective or not in the ultrasonic bonding inspection method of Embodiment 3, will be described. FIG. 27 is a diagram for illustrating how to determine whether bonding is defective or not in the ultrasonic bonding inspection method according to Embodiment 3 of the invention. FIG. 28 is a diagram for illustrating a case where bonding is determined to be non-defective by the ultrasonic bonding inspection method according to Embodiment 3 of the invention, and FIG. 29 is a diagram for illustrating a case where bonding is determined to be defective by the ultrasonic bonding inspection method according to Embodiment 3 of the invention. In FIG. 27, an application frequency waveform 81 of the ultrasonic wave to be applied and a detection frequency waveform 82 detected by the AE sensor 33 are shown. The detection frequency is, for example, the frequency f1 that is the same as a frequency of the ultrasonic horn 22 obtained through numerical arithmetic processing. In FIG. 27, the abscissa represents time, and the ordinate represents the application frequency or the detection frequency. The application frequency waveform 81 is an example in which, like the application energy or the applied force in FIG. 26, the frequency is weak as a first frequency until Time t1, and thereafter the frequency gradually increases until Time ta1 to reach a high frequency as a second frequency at Time ta1. The detection frequency waveform 82 detected by the AE sensor 33 is an example in which the frequency is weak as a first frequency until Time t2, the frequency begins to increase at Time t2 and the frequency gradually increases until Time ta2 to reach a high frequency as a second frequency at Time ta2. A detection frequency waveform 82a in FIG. 28 is a detection frequency waveform in the case where bonding of the ultrasonically bonded portion is non-defective, and a detection frequency waveform 82*b* in FIG. 29 is a detection frequency waveform in the case where bonding of the ultrasonically bonded portion is defective.

A time difference between Time t1 and Time t2, namely, Δt1 as a delay time resulting from subtracting Time t1 from Time t2, is an initial time difference (delay time) in varying frequency. A time difference between Time ta1 and Time ta2, namely, Δt2 as a delay time resulting from subtracting Time ta1 from Time ta2, is a final time difference (delay time) in varying frequency. Whether the bonding of the ultrasonically bonded portion is defective or not can be determined by using the initial time difference Δt1 in varying frequency or the final time difference Δt2 in varying frequency. Determination as to whether the bonding of the ultrasonically bonded portion is defective or not is executed in the bonded-state determination step as Step S003 shown in FIG. 10, FIG. 16, FIG. 19, FIG. 20 or FIG. 21.

First, an example of using the initial time difference Δt1 in varying frequency will be described. In the determination as to whether the bonding of the ultrasonically bonded portion is defective or not, namely, in the bonded-state determination step of determining the bonded state of the ultrasonically bonded portion, the bonded-state determination device 32 generates the detection frequency waveform 82 (frequency waveform) to be obtained through calculation from the waveform of the detection signal sig1 measured by the AE sensor 33. When a difference (time difference Δt1) between a timing (Time t2) at which the frequency varies in the detection frequency waveform 82 (detection frequency waveform 82*b* in FIG. 29) and a timing (Time t1) at which the frequency varies in the application frequency waveform 81, is more than a determination value tr1 given as a preset threshold value, the bonded-state determination device 32 determines that the bonded state of the ultrasonically bonded portion is defective. In contrast, when a difference (time difference Δt1) between a timing (Time t2) at which the frequency varies in the detection frequency waveform 82 (detection frequency waveform 82*a* in FIG. 28) and a timing (Time t1) at which the frequency varies in the application frequency waveform 81, is equal to or less than the preset determination value tr1, the bonded-state determination device 32 determines that the bonded state of the ultrasonically bonded portion is non-defective.

Next, an example of using the final time difference Δt2 in varying frequency will be described.

In the determination as to whether the bonding of the ultrasonically bonded portion is defective or not, namely, in the bonded-state determination step of determining the bonded state of the ultrasonically bonded portion, the bonded-state determination device 32 generates the detection frequency waveform 82 (frequency waveform) to be obtained through calculation from the waveform of the detection signal sig1 measured by the AE sensor 33. When a difference (time difference Δt2) between a timing (Time ta2) at which the frequency varies in the detection frequency waveform 82 (detection frequency waveform 82*b* in FIG. 29) and a timing (Time ta1) at which the frequency varies in the application frequency waveform 81, is more than a determination value tr2 given as a preset threshold value, the bonded-state determination device 32 determines that the bonded state of the ultrasonically bonded portion is defective. In contrast, when a difference (time difference Δt2) between a timing (Time ta2) at which the frequency varies in the detection frequency waveform 82 (detection frequency waveform 82*a* in FIG. 28) and a timing (Time ta1) at which the frequency varies in the application frequency waveform 81, is equal to or less than the preset determination value tr2, the bonded-state determination device 32 determines that the bonded state of the ultrasonically bonded portion is non-defective.

Furthermore, detection and feedback of a varying timing in the detection frequency waveform 82 allows increasing or decreasing the bonding time. This makes it possible to achieve an ultrasonically bonded portion having an excellent bonding strength. Such a method of executing the bonding process by changing the bonding condition based on whether the bonding of the ultrasonically bonded portion is defective or not, is similar to in the flowchart shown in FIG. 16. For the wire bonding process using the wire bonding apparatus, it suffices to read "terminal bonding" in the flowchart shown in FIG. 16, differently as "wire-end bonding". The flowchart shown in FIG. 16 with such a different reading will be described. In Step S001, product introduction is done. In Step S002, a first wire end, for example, a right-side wire end of the connecting wire 15*a* in FIG. 5, is subjected to ultrasonic bonding and the detection signal sig1 is monitored by the bonded-state measuring device 31 (detection signal monitoring step).

In Step S003, based on the detection signal sig1, the bonded-state determination device 32 determines the bonded state between the first wire end as the bonding member and the wiring pattern 10 as the bonding target member (bonded-state determination step). When, in Step S003, the bonded state is determined to be non-defective, the flow moves to Step S004. When, in Step S003, the bonded state is determined to be defective (bad), the flow moves to Step S007. In Step S007, whether the condition is changeable or not is determined (bonding condition determination step), and when it is determined to be changeable, the bonding condition is changed in Step S008 (bonding condition changing step), and then the flow returns to Step S002. When the condition is determined to be not changeable in Step S007, the flow terminates (defective bonding terminating step). Note that when the bonding condition changing step as Step S008 has been executed, the detection signal monitoring step as Step S002 and the bonded-state determination step as Step S003 to be executed in the ultrasonic bonding condition changed in the bonding-condition changing step, correspond to a bonding continuing step.

In Step S004, the wire-end bonding in operation is stopped (ultrasonic-wave application stopping step), and then the flow moves to Step S005. Note that the ultrasonic-wave application stopping step as Step S004 is also a non-defective bonding stopping step in which, when the bonded state between the bonding target member (wiring patterns 10*a*, 10*b* and 10*d*, electrode of the IGBT 12, and electrode of the FwDi 13) and the bonding member (connecting wires 15*a*, 15*b* and 15*c*) is determined to be non-defective in the bonded-state determination step as Step S003, the bonding process in operation for the bonding target member and the bonding member is stopped. In Step S005, it is determined whether or not bonding has been completed for all wire ends. When it is determined in Step S005 that a wire end to be bonded as the bonding member still remains, namely, bonding has not been completed, the flow returns to Step S002, whereas when it is determined that no wire end to be bonded remains, namely, bonding has been completed for all wire ends, the flow moves to Step S006. In the example shown in FIG. 5, six wire ends are provided, so that Steps S002 to S005 are executed six times. In Step S006, the product is discharged (product discharging step), so that the flow terminates. In Step S006, the upper jigs 25 are removed and the intermediate product of the power semiconductor device 1 is discharged from the ultrasonic bonding machine 20. When the bonding process for the intermediate product of one power semiconductor device 1 has been completed, the bonding process for an intermediate product of the next power semiconductor device 1 is executed.

It is noted that, when "terminal bonding" in the flowcharts in FIG. 10, FIG. 19, FIG. 20 and FIG. 21 is read differently as "wire-end bonding", it is also possible to execute the wire bonding process using the wire bonding apparatus, according to each of these flowcharts.

Further, in order to achieve an ultrasonically bonded portion having an adequate bonding strength, it is required to apply ultrasonic energy around the bonding interface between the wiring pattern 10 and the connecting wire 15. When the product is insufficiently fixed by the jig or the ultrasonic tool is attached loosely, an ultrasonically bonded portion having an adequate bonding strength is not achieved. Insufficient fixing by the jig is assumed to be due to warpage of the product, warpage or deterioration of the jig, deterioration or insufficient torque of the screw for fixing, or the like. It is assumed to be due to partial contact of the contacting surface, deterioration of the contacting surface, or the like, when the upper jig 25 is used for fixing the product (power semiconductor device 1). The AE signal is characterized in that the frequencies of AE signals generated due to these respective factors are different from each other. When the AE signal at the time of wire bonding is detected using the AE sensor 33 and the frequency of the AE signal is monitored on a time axis, it is possible to immediately identify the factor for reducing the strength of the ultrasonically bonded portion. When it is difficult to make identification because a frequency difference is slight, it is possible, by placing the AE sensors 33 respectively on the lower jig 24 at plural positions and on the outer surface of the ultrasonic horn 22, to identify the factor according to phase differences or amplitude levels of the AE signals individually detected by them. In the case of the wire bonding apparatus, the application energy of the ultrasonic wave to be applied is lower than that of the ultrasonic bonding apparatus 50 in Embodiments 1 and 2, so that the AE sensor 33 is allowed to be placed on the outer surface of the ultrasonic horn 22. Note that the AE sensor 33 is not allowed to be attached to the ultrasonic tool of the wire bonding apparatus. This is because, when the AE sensor 33 is attached to the ultrasonic tool that is light, its weight is changed, so that the vibration state of the ultrasonic tool varies.

Further, it is possible to determine whether the bonding is defective or not, according to a difference in phase (phase difference) between the waveform of the applied ultrasonic wave and the waveform of the AE signal. Namely, if the phase difference is small, this means that the application energy at the time of ultrasonic bonding is properly applied toward the bonding interface, and the AE signal at that instance is properly transmitted from the jig to the AE sensor 33. In contrast, if the phase difference is large, this is because a pathway through which the AE signal is transmitted has been extended due to a gap placed beneath the bonded portion and between the product and the jig, or the like, to thereby increase the time taken to reach the AE sensor 33. Accordingly, if the phase difference is large, this means that the energy of the ultrasonic wave is not properly applied toward the bonding interface.

It is noted that, in the respective embodiments, the power semiconductor element mounted in the power semiconductor device 1 is described as it is exemplified by the IGBT as a switching element and the FwDi as a rectifier element; however, it may be another switching element such as a MOSFET (Metal Oxide Semiconductor Field Effect Transistor), etc. or another rectifier element such as an SBD (Schottky Barrier Diode), etc. Further, the power semiconductor element mounted in the power semiconductor device 1 may be a usual element whose base member is a silicon wafer; however, a so-called wide bandgap semiconductor material may be used therefor that is wider in bandgap than silicon and is represented by silicon carbide (SiC), a gallium nitride (GaN)-based material or diamond. For example, when silicon carbide (SiC), a gallium nitride (GaN)-based material or diamond is used for the IGBT 12 serving as a switching element or the FwDi 13 serving as a rectifier element, because its power loss is lower than that of a conventionally-used element formed of silicon (Si), the efficiency of the power semiconductor device 1 can be enhanced. Further, because the withstanding voltage is high and the allowable current density is also high, the power semiconductor device 1 can be downsized. Furthermore, because the wide bandgap semiconductor element has high heat resistance, it is operable at a high temperature. This allows a heatsink to be downsized and a water cooling unit to be substituted with an air cooling one, so that the power semiconductor device provided with the heatsink can be further downsized.

As described previously, because of dealing with large current, the power semiconductor device 1 is designed to efficiently dissipate heat and thus, the power semiconductor device 1 using a wide bandgap semiconductor material is also designed to efficiently dissipate heat. The ultrasonic bonding apparatus 50 in Embodiment 1, Embodiment 2 and Embodiment 3 can inspect the bonding quality in real time in the bonding process on the basis of the detection signal(s) of the AE sensor 33 or/and the laser Doppler vibrometer 56, without directly monitoring the temperature of the terminal bonded portion using a thermo-viewer. This makes it possible to properly perform inspection of the ultrasonic bonding of the power semiconductor device 1 using the wide bandgap semiconductor material.

Figure 30:
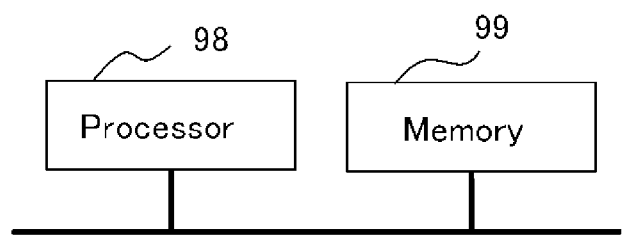
FIG. 30 is a diagram showing a hardware configuration example for implementing function blocks of the bonded-state determination device.

It is noted that, with respect to the signal input unit 36, the signal processing unit 37, the arithmetic processing unit 38, the determination unit 39 and the determination result output unit 40, that are function blocks of the bonded-state determination device 32, their functions may be implemented by a processor 98 and a memory 99 shown in FIG. 30. FIG. 30 is a diagram showing a hardware configuration example for implementing the function blocks of the bonded-state determination device. In this case, the signal input unit 36, the signal processing unit 37, the arithmetic processing unit 38, the determination unit 39 and the determination result output unit 40 are implemented in such a manner that the processor 98 executes programs stored in the memory 99. Instead, plural processors 98 and plural memories 99 may execute the respective functions in their cooperative manner.

It should be noted that a combination of the respective embodiments and an appropriate modification/omission in the embodiments may be made in the present invention without departing from the scope of the invention.

DESCRIPTION OF REFERENCE NUMERALS AND SIGNS

1: power semiconductor device (fixed object), 4: main terminal (bonding member), 5: signal terminal (bonding member), 10, 10*a*, 10*b*, 10*c*, 10*d*: wiring pattern (bonding target member), 15, 15*a*, 15*b*, 15*c*: connecting wire (bonding member), 20: ultrasonic bonding machine, 21: ultrasonic tool, 24: lower jig, 25: upper jig, 28: housing, 30: bonding inspection apparatus, 31: bonded-state measuring device, 32: bonded-state determination device, 33: AE sensor, 37: signal processing unit, 38: arithmetic processing unit, 56: laser Doppler vibrometer (non-contact vibrometer), 50: ultrasonic bonding apparatus, 71: AE signal waveform, 72: AE signal waveform, 74: arithmetically-processed waveform, 75: arithmetically-processed waveform, 81: application frequency waveform, 82, 82a, 82b: detection frequency waveform, sig1: detection signal, sig2: determination result signal (determination result), Δt1, Δt2: time difference, tr1, tr2: determination value.

The invention claimed is:

1. An ultrasonic bonding apparatus for bonding a bonding target member and a bonding member together using an ultrasonic wave, comprising:
    an ultrasonic bonding machine having an ultrasonic tool for applying the ultrasonic wave to the bonding target member mounted on a fixed object fixed to a jig, while pressing the bonding member against the bonding target member; and
    a bonding inspection apparatus for inspecting a bonding quality of the bonding target member and the bonding member;
    wherein the bonding inspection apparatus comprises:
    a bonded-state measuring device for detecting a vibration propagating in the jig or a housing of the ultrasonic bonding machine equipped with the jig, using a sensor that is fixed to the jig or the housing at a position at which it does not make contact with the bonding target member and the bonding member and that detects the vibration, to thereby output a detection signal; and
    a bonded-state determination device for determining, in a bonding process for the bonding target member and the bonding member, a bonded state between the bonding target member and the bonding member on the basis of a frequency component that is found, in an arithmetically-processed waveform obtained through numerical arithmetic processing from a waveform of the detection signal outputted by the bonded-state measuring device, at a frequency that is other than an application frequency of the ultrasonic wave applied by the ultrasonic tool and frequencies that are natural times said application frequency, and is higher than said application frequency.

2. The ultrasonic bonding apparatus of claim 1, wherein the fixed object is a power semiconductor device having a casing, the bonding target member is a wiring pattern of the power semiconductor device, and, in the bonding member, its portion to be bonded to the bonding target member is placed inside the casing.

3. The ultrasonic bonding apparatus of claim 1, wherein the sensor is fixed to the jig and the bonded-state measuring device detects the vibration propagating in the jig.

4. The ultrasonic bonding apparatus of claim 1, wherein the vibration is an acoustic emission and the bonded-state measuring device comprises, as said sensor, an AE sensor that detects the acoustic emission.

5. The ultrasonic bonding apparatus of claim 1, wherein the bonded-state measuring device further comprises a non-contact vibrometer for detecting a vibration of a measuring object vibrated by the ultrasonic wave, and
    wherein the non-contact vibrometer detects a vibration of at least one of the bonding target member, the bonding member, the ultrasonic tool and the jig, to thereby output a detection signal.

6. The ultrasonic bonding apparatus of claim 1, wherein the ultrasonic bonding machine performs bonding between the bonding target member and the bonding member after changing an ultrasonic bonding condition in said bonding process on the basis of a determination result determined by the bonded-state determination device.

\* \* \* \* \*